United States Patent
Roberts et al.

(10) Patent No.: US 12,245,523 B2
(45) Date of Patent: *Mar. 4, 2025

(54) QUANTUM DOT DEVICES WITH FINS

(71) Applicant: Intel Corporation, Santa Clara, CA (US)

(72) Inventors: Jeanette M. Roberts, North Plains, OR (US); Ravi Pillarisetty, Portland, OR (US); David J. Michalak, Portland, OR (US); Zachary R. Yoscovits, Beaverton, OR (US); James S. Clarke, Portland, OR (US); Van H. Le, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,439

(22) Filed: Apr. 17, 2023

(65) Prior Publication Data

US 2023/0263076 A1 Aug. 17, 2023

Related U.S. Application Data

(63) Continuation of application No. 17/592,724, filed on Feb. 4, 2022, now Pat. No. 11,700,776, which is a continuation of application No. 16/305,592, filed as application No. PCT/US2016/036568 on Jun. 9, 2016, now Pat. No. 11,387,399.

(51) Int. Cl.
*H10N 60/10* (2023.01)
*G06N 10/00* (2022.01)
*H10N 60/01* (2023.01)
*H10N 60/12* (2023.01)
*H10N 60/80* (2023.01)

(52) U.S. Cl.
CPC ........... *H10N 60/128* (2023.02); *G06N 10/00* (2019.01); *H10N 60/0912* (2023.02); *H10N 60/12* (2023.02); *H10N 60/805* (2023.02)

(58) Field of Classification Search
CPC .. H10N 60/128; H10N 60/0912; H10N 60/12; H10N 60/805; G06N 10/00; B82Y 10/00; B82Y 40/00
See application file for complete search history.

(56) References Cited

U.S. PATENT DOCUMENTS

| | | | |
|---|---|---|---|
| 2005/0184285 A1* | 8/2005 | Friesen | B82Y 10/00 257/14 |
| 2012/0074386 A1* | 3/2012 | Rachmady | H01L 29/267 438/296 |
| 2015/0214340 A1* | 7/2015 | Maeda | H01L 27/0924 438/283 |

* cited by examiner

*Primary Examiner* — Syed I Gheyas
(74) *Attorney, Agent, or Firm* — Akona IP PC

(57) ABSTRACT

Disclosed herein are quantum dot devices, as well as related computing devices and methods. For example, in some embodiments, a quantum dot device may include: a substrate and a quantum well stack disposed on the substrate. The quantum well stack may include a quantum well layer and a back gate, and the back gate may be disposed between the quantum well layer and the substrate.

22 Claims, 19 Drawing Sheets

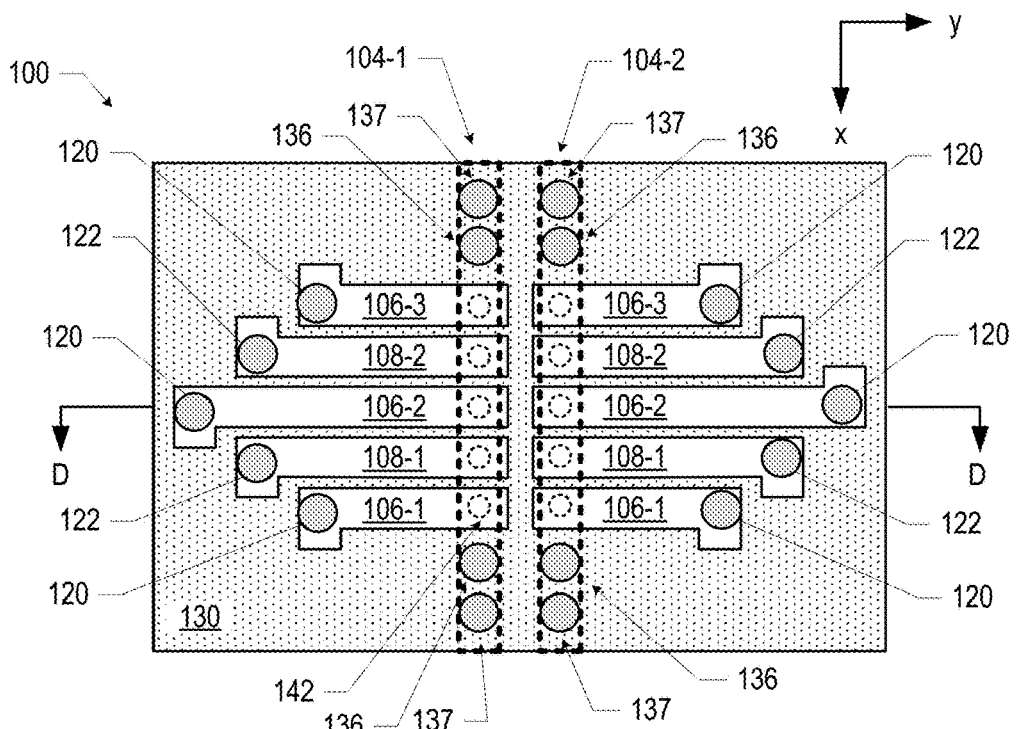
FIG. 3
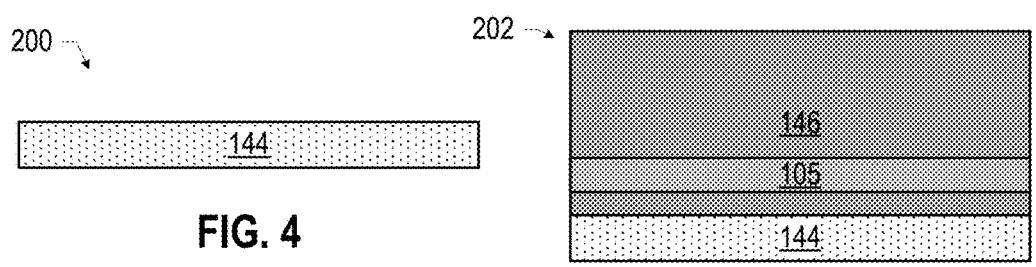
FIG. 4
FIG. 5
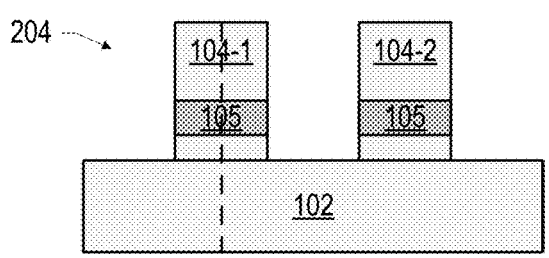
FIG. 6
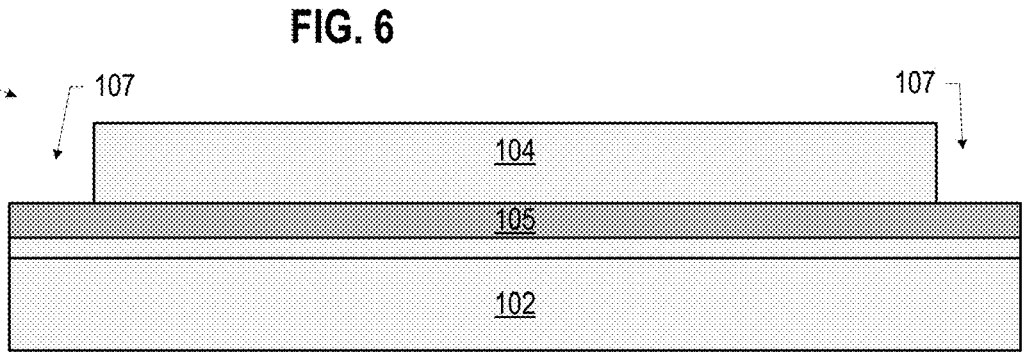
FIG. 7

1040 ─╲

┌─────────────────────────────────────────────────────────┐
│ Apply a voltage to a first gate disposed on a quantum well stack region to │
│ cause a first quantum dot to form in a first quantum well in the quantum │
│ well stack region under the first gate, wherein the quantum well stack │
│ region includes a back gate │
│ 1042 │
└─────────────────────────────────────────────────────────┘
                              ↓
┌─────────────────────────────────────────────────────────┐
│ Apply a voltage to a second gate disposed on the quantum well stack │
│ region to cause a second quantum dot to form in a second quantum well │
│ in the quantum well stack region under the second gate │
│ 1044 │
└─────────────────────────────────────────────────────────┘
                              ↓
┌─────────────────────────────────────────────────────────┐
│ Apply a voltage to a third gate disposed on the quantum well stack region │
│ to (1) cause a third quantum dot to form in a third quantum well in the │
│ quantum well stack region under the third gate or (2) provide a potential │
│ barrier between the first quantum well and the second quantum well │
│ 1046 │
└─────────────────────────────────────────────────────────┘

FIG. 50

QUANTUM DOT DEVICES WITH FINS

CROSS-REFERENCE TO RELATED APPLICATIONS

This Application is a continuation and claims the benefit of priority under 35 U.S.C. § 120 of U.S. application Ser. No. 17/592,724, filed Feb. 4, 2022, entitled "QUANTUM DOT DEVICES WITH FINS," and issued as U.S. Pat. No. 11,700,776, which is a continuation of U.S. application Ser. No. 16/305,592, filed Nov. 29, 2018, entitled "QUANTUM DOT DEVICES WITH BACK GATES," issued as U.S. Pat. No. 11,387,399, which is a national stage application under 35 U.S.C. § 371 of PCT International Application Serial No. PCT/US2016/036568, filed on Jun. 9, 2016, and entitled "QUANTUM DOT DEVICES WITH BACK GATES," all of which are hereby incorporated by reference herein their entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1-3 are cross-sectional views of a quantum dot device, in accordance with various embodiments.

FIGS. 4-25 illustrate various example stages in the manufacture of a quantum dot device, in accordance with various embodiments.

FIG. 48 is a flow diagram of an illustrative method of manufacturing a quantum dot device, in accordance with various embodiments.

FIGS. 49-50 are flow diagrams of illustrative methods of operating a quantum dot device, in accordance with various embodiments.

DETAILED DESCRIPTION

Figure 1:
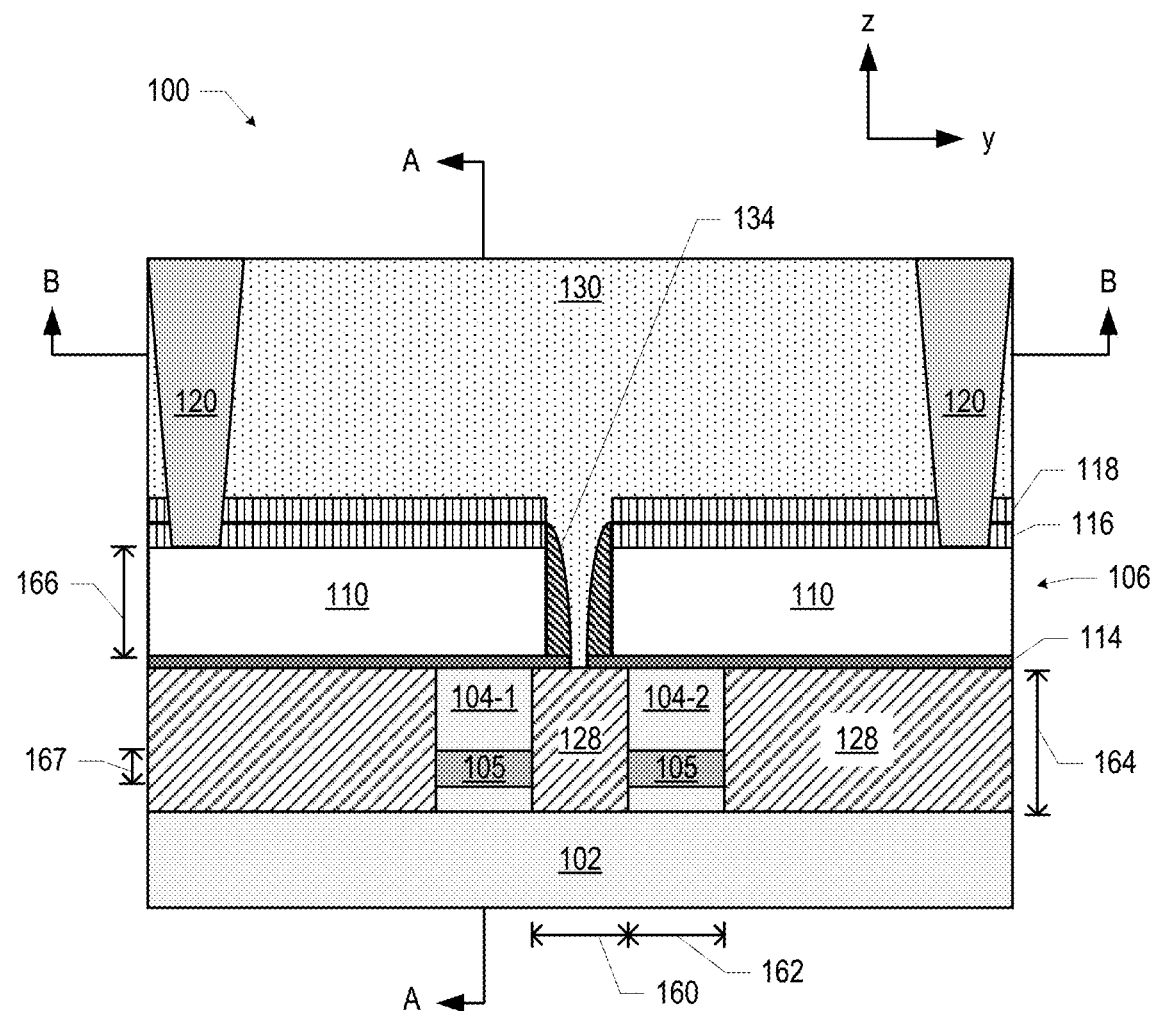

Disclosed herein are quantum dot devices, as well as related computing devices and methods. For example, in some embodiments, a quantum dot device may include: a substrate and a quantum well stack disposed on the substrate. The quantum well stack may include a quantum well layer and a back gate, and the back gate may be disposed between the quantum well layer and the substrate.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

Figure 2:
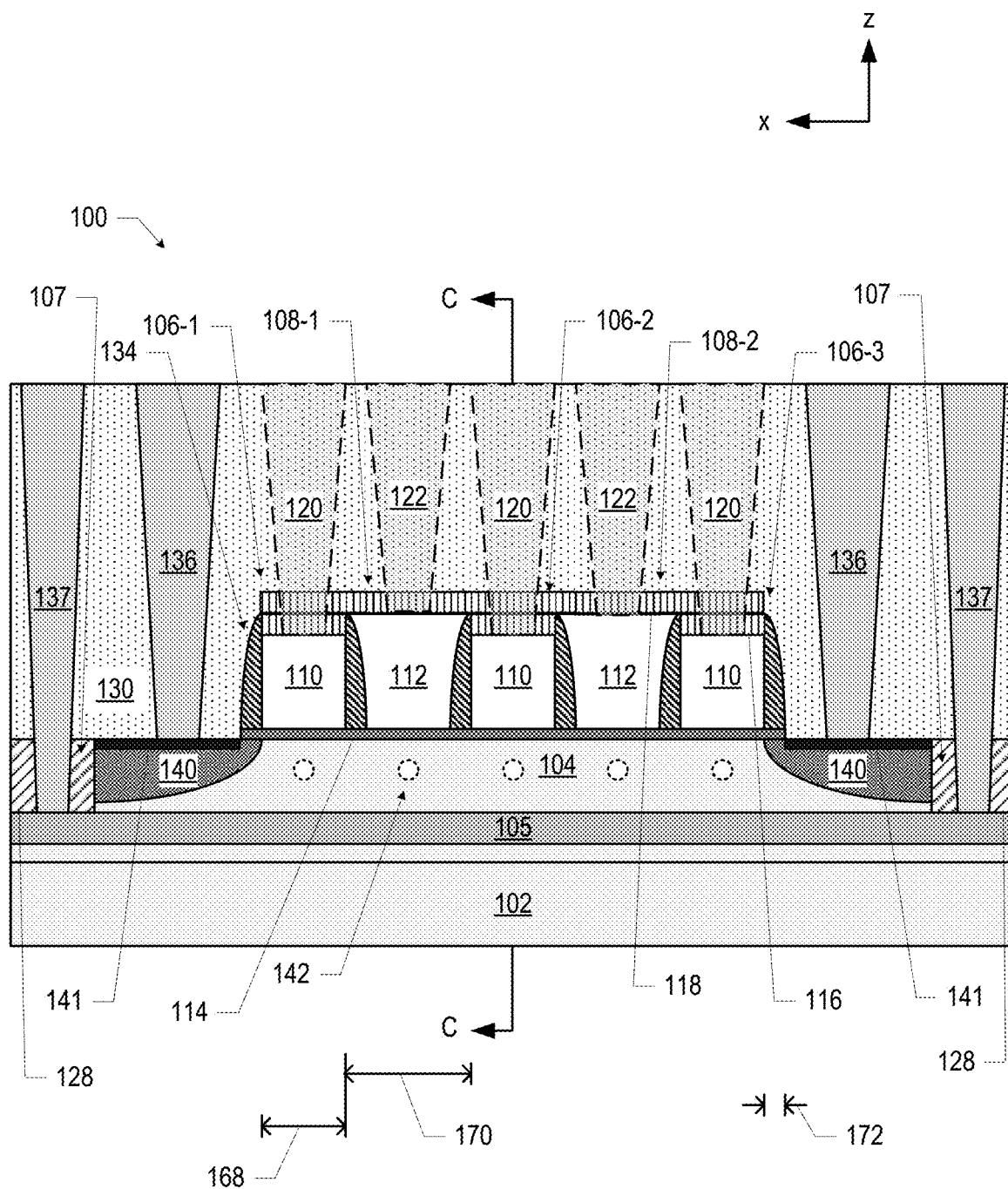

FIGS. 1-3 are cross-sectional views of a quantum dot device 100, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), and FIG. 3 illustrates the quantum dot device 100 taken along the section B-B of FIG. 1 with a number of components not shown to more readily illustrate how the gates 106/108 may be patterned (while FIG. 1 illustrates a quantum dot device 100 taken along the section D-D of FIG. 3). Although FIG. 1 indicates that the cross-section illustrated in FIG. 2 is taken through the fin 104-1, an analogous cross section taken through the fin 104-2 may be identical, and thus the discussion of FIG. 2 refers generally to the "fin 104."

The quantum dot device 100 may include a base 102 and multiple fins 104 extending away from the base 102. The base 102 and the fins 104 may include a substrate and a quantum well stack (not shown in FIGS. 1-3, but discussed below with reference to the substrate 144 and the quantum well stack 146), distributed in any of a number of ways between the base 102 and the fins 104. The base 102 may include at least some of the substrate, and the fins 104 may each include a quantum well layer of the quantum well stack (discussed below with reference to the quantum well layer 152). Examples of base/fin arrangements are discussed below with reference to the base fin arrangements 158 of FIGS. 29-35.

Although only two fins, 104-1 and 104-2, are shown in FIGS. 1-3, this is simply for ease of illustration, and more than two fins 104 may be included in the quantum dot device 100. In some embodiments, the total number of fins 104 included in the quantum dot device 100 is an even number, with the fins 104 organized into pairs including one active fin 104 and one read fin 104, as discussed in detail below. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104 for ease of illustration, but all the teachings of the present disclosure apply to quantum dot devices 100 with more fins 104.

As noted above, each of the fins 104 may include a quantum well layer (not shown in FIGS. 1-3, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 and 30 nanometers. In some embodiments, the fins 104 may each have a height 164 between 200 and 400 nanometers (e.g., between 250 and 350 nanometers, or equal to 300 nanometers).

The fins 104 may be arranged in parallel, as illustrated in FIGS. 1 and 3, and may be spaced apart by an insulating material 128, which may be disposed on opposite faces of the fins 104. The insulating material 128 may be a dielectric material, such as silicon oxide. For example, in some embodiments, the fins 104 may be spaced apart by a distance 160 between 100 and 250 microns.

Multiple gates may be disposed on each of the fins 104. In the embodiment illustrated in FIG. 2, three gates 106 and two gates 108 are shown as distributed on the top of the fin 104. This particular number of gates is simply illustrative, and any suitable number of gates may be used. Additionally, as discussed below with reference to FIG. 39, multiple groups of gates (like the gates illustrated in FIG. 2) may be disposed on the fin 104.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 2, the gate dielectric 114 for all of the gates 106/108 is provided by a common layer of gate dielectric material. In other embodiments, the gate dielectric 114 for each of the gates 106/108 may be provided by separate portions of gate dielectric 114 (e.g., as discussed below with reference to FIGS. 40-44). In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 2 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 2, and insulating spacers 134 may be disposed on the sides of the gate metal 110 and the hardmask 116. As illustrated in FIG. 2, the spacers 134 may be thicker closer to the fin 104 and thinner farther away from the fin 104. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the fin 104. In the embodiment illustrated in FIG. 2, the hardmask 118 may extend over the hardmask 116 (and over the gate metal 110 of the gates 106), while in other embodiments, the hardmask 118 may not extend over the gate metal 110 (e.g., as discussed below with reference to FIG. 45). In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108-1 may extend between the proximate spacers 134 on the sides of the gate 106-1 and the gate 106-2, as shown in FIG. 2. In some embodiments, the gate metal 112 of the gate 108-1 may extend between the spacers 134 on the sides of the gate 106-1 and the gate 106-2. Thus, the gate metal 112 of the gate 108-1 may have a shape that is substantially complementary to the shape of the spacers 134, as shown. Similarly, the gate 108-2 may extend between the proximate spacers 134 on the sides of the gate 106-2 and the gate 106-3. In some embodiments in which the gate dielectric 114 is not a layer shared commonly between the gates 108 and 106, but instead is separately deposited on the fin 104 between the spacers 134 (e.g., as discussed below with reference to FIGS. 40-44), the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the ones illustrated in FIGS. 2, 38, and 45, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIG. 1, the gates 106/108 on one fin 104 may extend over the insulating material 128 beyond their respective fins 104 and towards the other fin 104, but may be isolated from their counterpart gates by the intervening insulating material 130 and spacers 134.

As shown in FIG. 2, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 2 and 3 for ease of illustration, but five are indicated as dotted circles in each fin 104. The location of the quantum dots 142 in FIG. 2 is not intended to indicate a particular geometric positioning of the quantum dots 142. The spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide (e.g., as discussed below with reference to FIGS. 22-23). In some embodiments, the interface material 141 may be a non-silicide compound, such as titanium nitride. In some embodiments, the interface material 141 may be a metal (e.g., aluminum, tungsten, or indium).

The quantum dot device 100 may include a back gate 105. During operation of the quantum dot device 100, a voltage applied to the back gate 105 may change the conductance of the quantum well layer 152, allowing or preventing charge carriers from flowing through the quantum well layer 152 (e.g., to/from the doped regions 140). For example, for an n-type quantum dot device 100, a positive potential could be applied to the back gate 105 to increase the conductance of the channel in the quantum well layer 152. Thus, the back gate 105 may provide a mechanism for adjusting the supply of charge carriers in the quantum well layer 152.

The back gate 105 may be conductive (e.g., formed of a doped semiconductor material), and may be arranged in the quantum dot device 100 such that the quantum well layer in a fin 104 is disposed between the back gate 105 and the gates 106/108 on the fin 104. In some embodiments, different back gates 105 may be included in different ones of the fins 104 in a quantum dot device 100 (e.g., as illustrated in FIG. 1).

In some embodiments, the back gate 105 may be formed during formation of the quantum well stack (discussed below with reference to the quantum well stacks 146), and in embodiments in which the back gate 105 is included in a fin 104, the back gate 105 may be patterned into the fin 104 along with the rest of the quantum well stack. In some embodiments, the back gate 105 may be formed of a metal (e.g., titanium nitride or any of the metals discussed herein with reference to the conductive vias); such an embodiment may be useful when the metal of the back gate 105 is adequately lattice-matched to the layer formed on the back gate 105 in the quantum well stack 146. In other embodiments, the back gate 105 may be formed of a semiconductor that has been doped to conduct carriers of choice (as discussed in detail below).

The doped regions 140 may be electrically isolated from the back gate 105 by intervening materials in the quantum well stack (e.g., in the fin 104, as shown). The dimensions of the back gate 105 may take any suitable values. For example, in some embodiments, the back gate 105 may have a thickness 167 between 2 nanometers and 50 nanometers (e.g., 5-20 nanometers, or approximately 10 nanometers). The position of the back gate 105 in the fin 104 in FIGS. 1 and 2 is not limiting, and as discussed below with reference to FIGS. 26-35, the back gate 105 may be arranged in any suitable location in a fin 104.

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-3, the gates 106 may extend away from the fins 104, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may extend away from the fins 104, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

As illustrated in FIG. 2, in some embodiments, the fins 104 may include recesses 107 that extend down to the back gate 105 (and thus "expose" a portion of the back gate 105 that would otherwise be covered by other material of the quantum well stack). Conductive vias 137 may extend into the recesses 107 to make conductive contact with the back gate 105. The recesses 107 may be filled with an insulating material (e.g., the insulating material 128) prior to formation of the conductive vias 137, and thus the conductive vias 137 may extend through the insulating material 128 (and the insulating material 130) to make contact with the back gate 105.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 120, 122, 136, and 137 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 120/122/136/137 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-3 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation.

The quantum dot devices 100 disclosed herein may be manufactured using any suitable techniques. FIGS. 4-25 illustrate various example stages in the manufacture of the quantum dot device 100 of FIGS. 1-3, in accordance with various embodiments. Although the particular manufacturing operations discussed below with reference to FIGS. 4-25 are illustrated as manufacturing a particular embodiment of the quantum dot device 100, these operations may be applied to manufacture many different embodiments of the quantum dot device 100, as discussed herein. Any of the elements discussed below with reference to FIGS. 4-25 may take the form of any of the embodiments of those elements discussed above (or otherwise disclosed herein).

FIG. 4 illustrates a cross-sectional view of an assembly 200 including a substrate 144. The substrate 144 may include any suitable semiconductor material or materials. In some embodiments, the substrate 144 may include a semiconductor material. For example, the substrate 144 may include silicon (e.g., may be formed from a silicon wafer).

FIG. 5 illustrates a cross-sectional view of an assembly 202 subsequent to providing a quantum well stack 146 on the substrate 144 of the assembly 200 (FIG. 4). The quantum well stack 146 may include a quantum well layer (not shown) in which a 2DEG may form during operation of the quantum dot device 100. The quantum well stack 146 may also include a back gate 105. The position of the back gate 105 in the quantum well stack 146 in FIG. 5 is not limiting, and as discussed below with reference to FIGS. 26-35, the back gate 105 may be arranged in any suitable location in a quantum well stack 146. Various embodiments of the quantum well stack 146 are discussed below with reference to FIGS. 26-28.

FIG. 6 illustrates a cross-sectional view of an assembly 204 subsequent to forming fins 104 in the assembly 202 (FIG. 5). The fins 104 may extend from a base 102, and may be formed in the assembly 202 by patterning and then etching the assembly 202, as known in the art. For example, a combination of dry and wet etch chemistry may be used to form the fins 104, and the appropriate chemistry may depend on the materials included in the assembly 202, as known in the art. At least some of the substrate 144 may be included in the base 102, and at least some of the quantum well stack 146 may be included in the fins 104. In particular, the quantum well layer (not shown) of the quantum well stack 146 may be included in the fins 104. In some embodiments, the back gate 105 may be included in the fins 104. Example arrangements in which the quantum well stack 146 and the substrate 144 are differently included in the base 102 and the fins 104 are discussed below with reference to FIGS. 29-35. The fins 104 of the assembly 202 may also include recesses 107 that extend down to the back gate 105; FIG. 7 is another cross-sectional view of the assembly 204, taken along the dashed line of FIG. 6, and illustrating the recesses 107. The recesses 107 may be patterned and etched as discussed above with reference to the formation of the fins 104.

Figure 8:
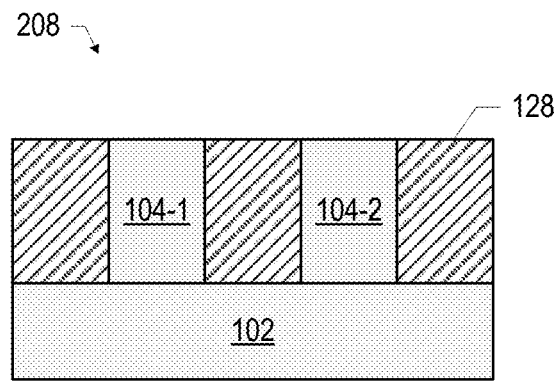

FIG. 8 illustrates a cross-sectional view of an assembly 208 subsequent to providing an insulating material 128 to the assembly 204 (FIGS. 6 and 7), and then planarizing the resulting structure to remove the insulating material 128 above the fins 104. Any suitable material may be used as the insulating material 128 to electrically insulate the fins 104 from each other. As noted above, in some embodiments, the insulating material 128 may be a dielectric material, such as silicon oxide. In some embodiments, the assembly 206 may be planarized using a chemical mechanical polishing (CMP) technique.

Figure 9:
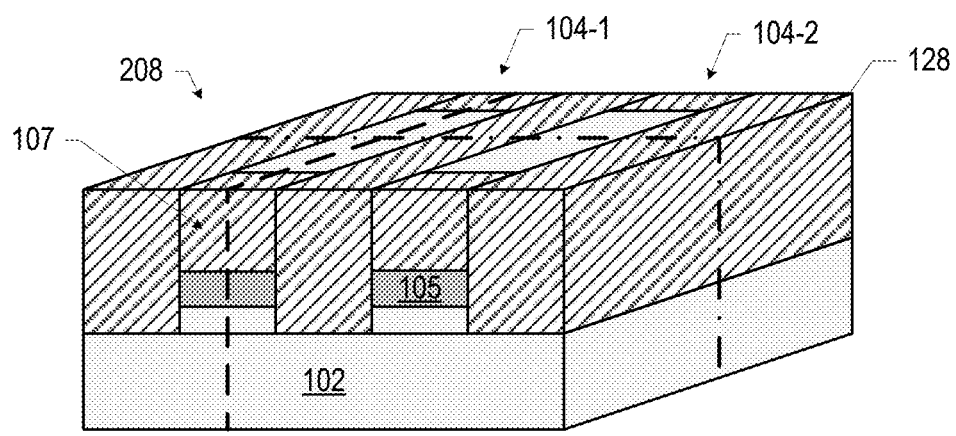
Figure 10:
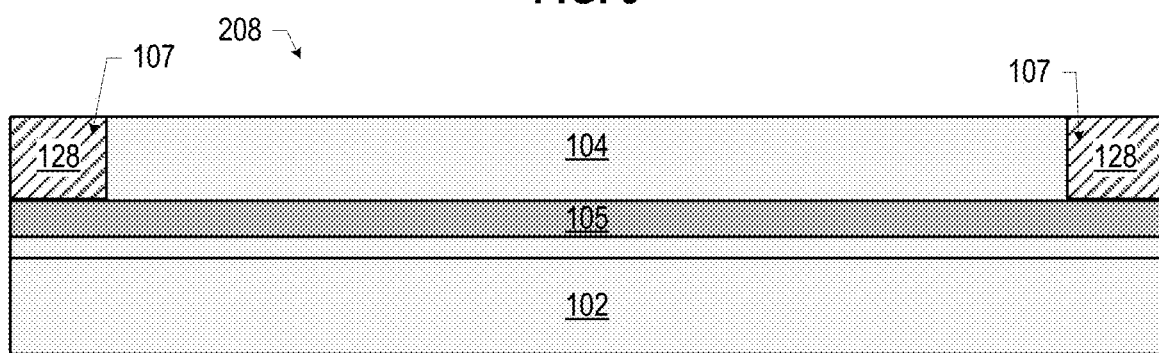

FIG. 9 is a perspective view of at least a portion of the assembly 208, showing the fins 104 extending from the base 102 and separated by the insulating material 128. FIG. 9 also illustrates the recesses 107 filled with the insulating material 128 (extending down to the back gates 105). The cross-sectional views of FIGS. 4-8 are taken parallel to the plane of the page of the perspective view of FIG. 9. FIG. 10 is another cross-sectional view of the assembly 208, taken along the dashed line along the fin 104-1 in FIG. 9. The cross-sectional views illustrated in FIGS. 11-25 are taken along the same cross-section as FIG. 10.

Figure 11:
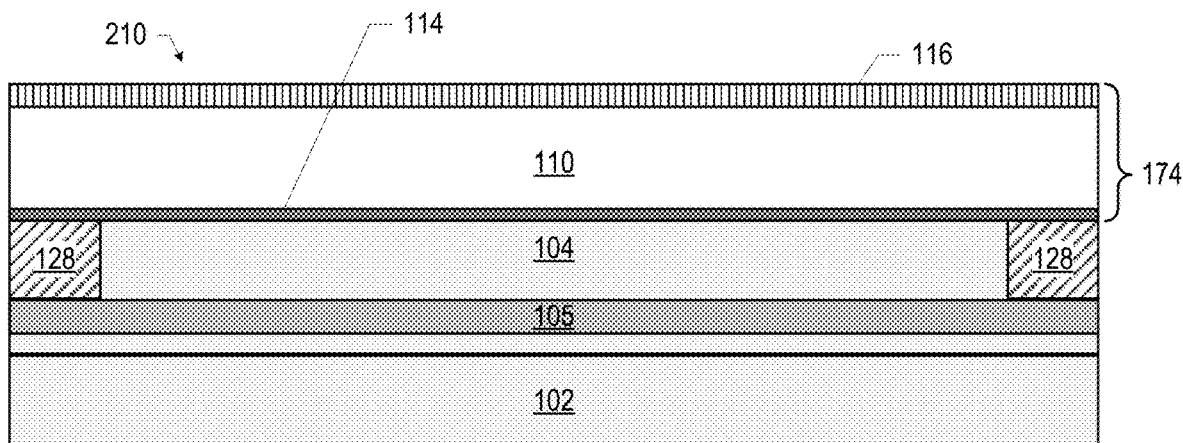

FIG. 11 is a cross-sectional view of an assembly 210 subsequent to forming a gate stack 174 on the fins 104 of the assembly 208 (FIGS. 8-10). The gate stack 174 may include the gate dielectric 114, the gate metal 110, and a hardmask 116. The hardmask 116 may be formed of an electrically insulating material, such as silicon nitride or carbon-doped nitride.

Figure 12:
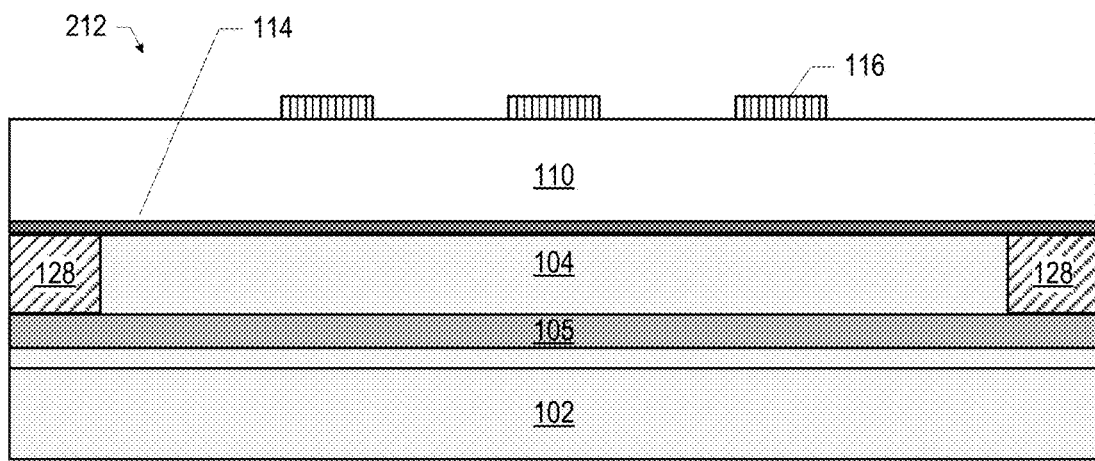

FIG. 12 is a cross-sectional view of an assembly 212 subsequent to patterning the hardmask 116 of the assembly 210 (FIG. 11). The pattern applied to the hardmask 116 may correspond to the locations for the gates 106, as discussed below. The hardmask 116 may be patterned by applying a resist, patterning the resist using lithography, and then etching the hardmask (using dry etching or any appropriate technique).

Figure 13:
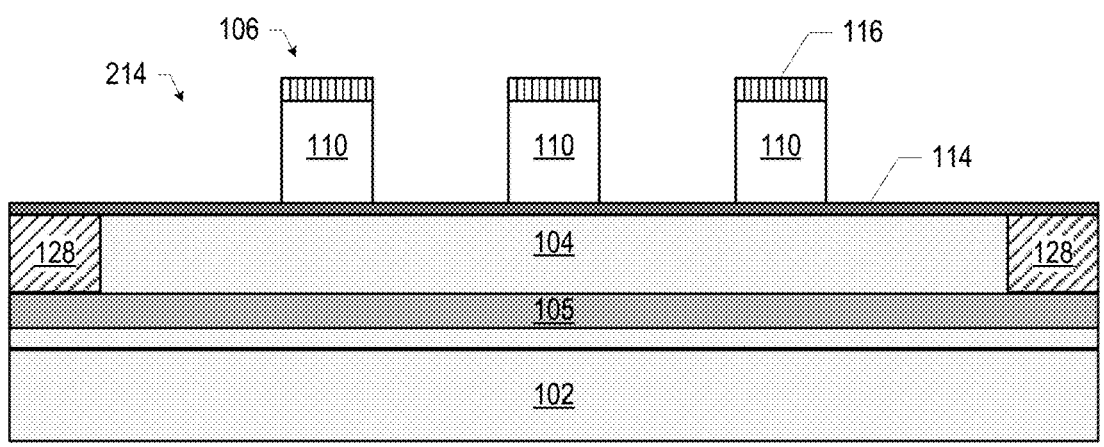

FIG. 13 is a cross-sectional view of an assembly 214 subsequent to etching the assembly 212 (FIG. 12) to remove the gate metal 110 that is not protected by the patterned hardmask 116 to form the gates 106. In some embodiments, as illustrated in FIG. 13, the gate dielectric 114 may remain after the etched gate metal 110 is etched away; in other embodiments, the gate dielectric 114 may also be etched during the etching of the gate metal 110. Examples of such embodiments are discussed below with reference to FIGS. 40-44.

Figure 14:
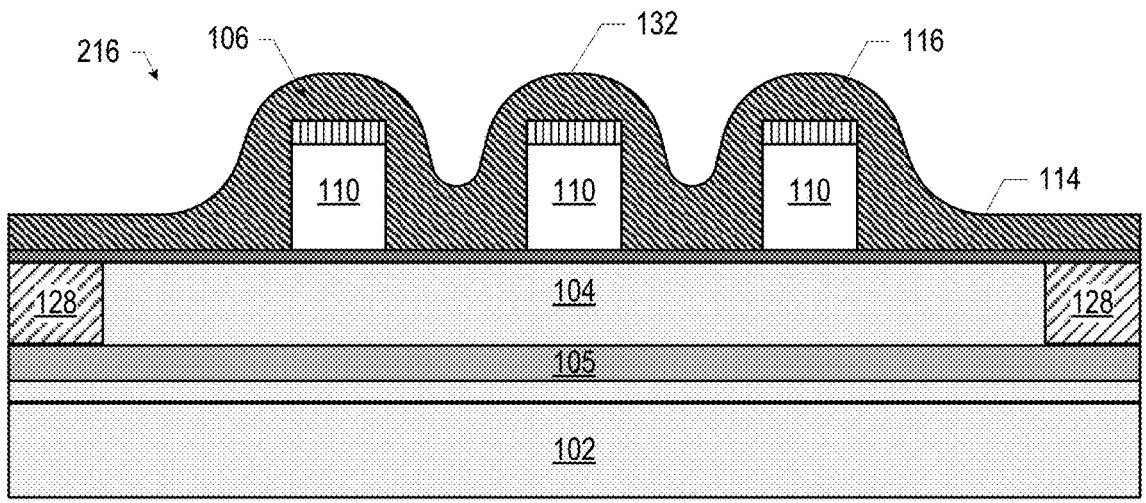

FIG. 14 is a cross-sectional view of an assembly 216 subsequent to providing spacer material 132 on the assembly 214 (FIG. 13). The spacer material 132 may include any of the materials discussed above with reference to the spacers 134, for example, and may be deposited using any suitable technique. For example, the spacer material 132 may be a nitride material (e.g., silicon nitride) deposited by sputtering.

Figure 15:
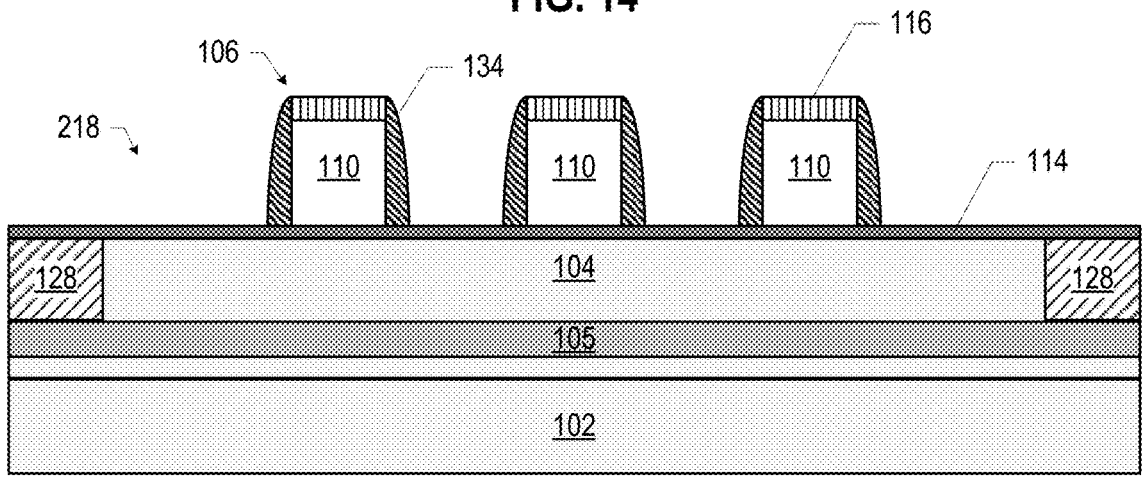

FIG. 15 is a cross-sectional view of an assembly 218 subsequent to etching the spacer material 132 of the assembly 216 (FIG. 14), leaving spacers 134 formed of the spacer material 132 on the sides of the gates 106 (e.g., on the sides of the hardmask 116 and the gate metal 110). The etching of the spacer material 132 may be an anisotropic etch, etching the spacer material 132 "downward" to remove the spacer material 132 on top of the gates 106 and in some of the area between the gates 106, while leaving the spacers 134 on the sides of the gates 106. In some embodiments, the anisotropic etch may be a dry etch.

Figure 16:
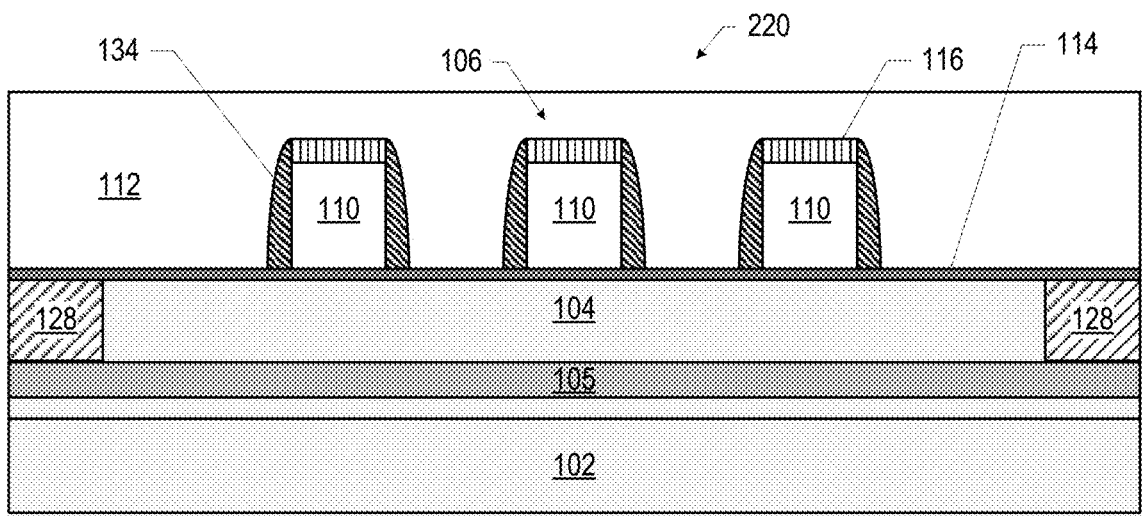

FIG. 16 is a cross-sectional view of an assembly 220 subsequent to providing the gate metal 112 on the assembly 218 (FIG. 15). The gate metal 112 may fill the areas between adjacent ones of the gates 106, and may extend over the tops of the gates 106.

Figure 17:
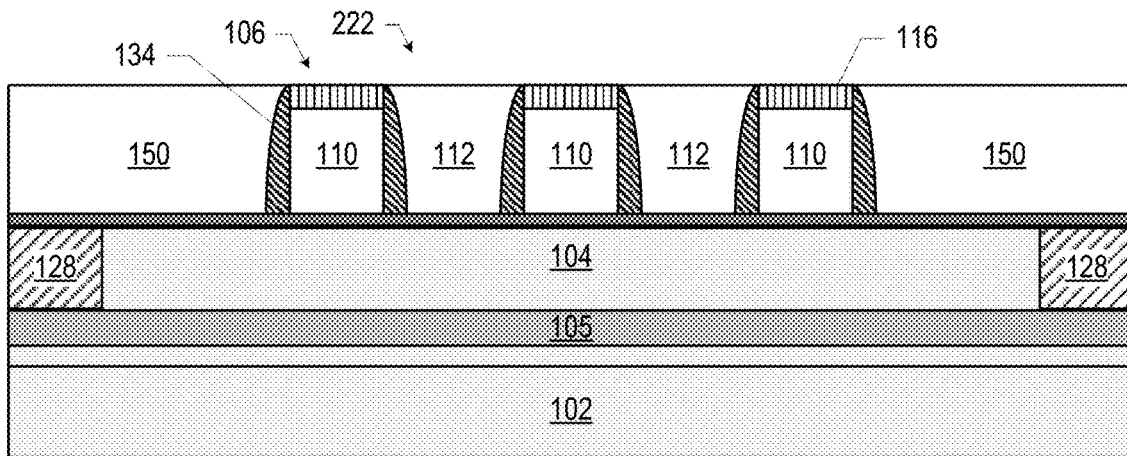

FIG. 17 is a cross-sectional view of an assembly 222 subsequent to planarizing the assembly 220 (FIG. 16) to remove the gate metal 112 above the gates 106. In some embodiments, the assembly 220 may be planarized using a CMP technique. Some of the remaining gate metal 112 may fill the areas between adjacent ones of the gates 106, while other portions 150 of the remaining gate metal 112 may be located "outside" of the gates 106.

Figure 18:
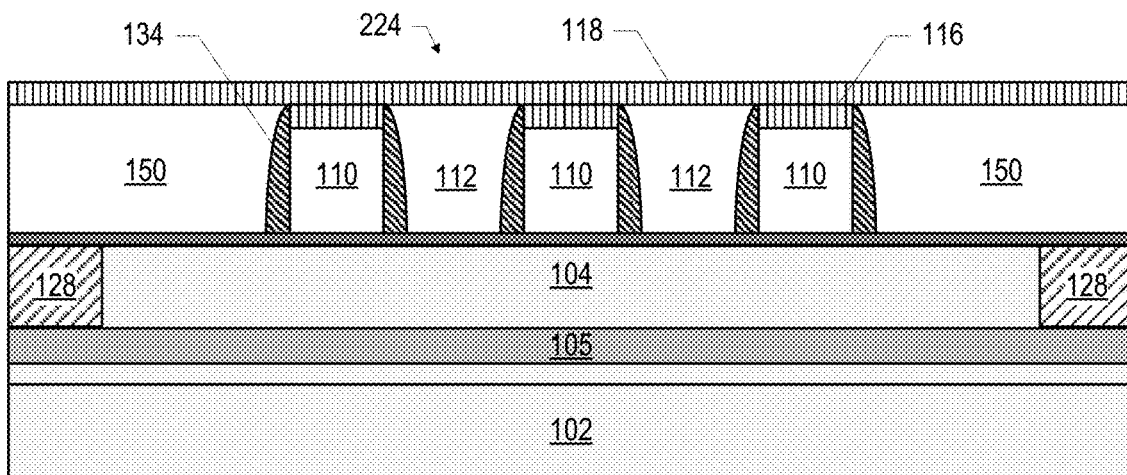

FIG. 18 is a cross-sectional view of an assembly 224 subsequent to providing a hardmask 118 on the planarized surface of the assembly 222 (FIG. 17). The hardmask 118 may be formed of any of the materials discussed above with reference to the hardmask 116, for example.

Figure 19:
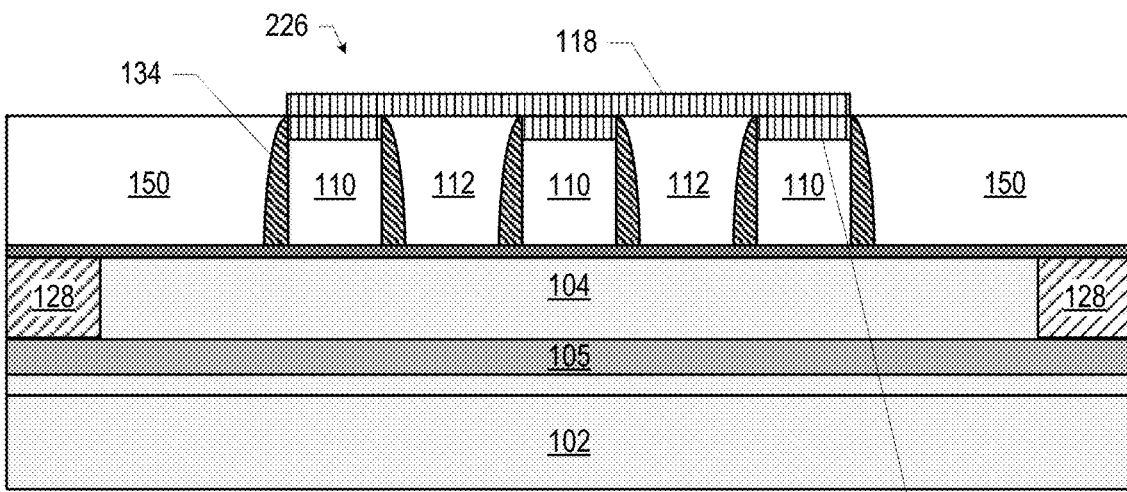

FIG. 19 is a cross-sectional view of an assembly 226 subsequent to patterning the hardmask 118 of the assembly 224 (FIG. 18). The pattern applied to the hardmask 118 may extend over the hardmask 116 (and over the gate metal 110 of the gates 106, as well as over the locations for the gates 108 (as illustrated in FIG. 2). The hardmask 118 may be non-coplanar with the hardmask 116, as illustrated in FIG. 19. The hardmask 118 illustrated in FIG. 19 may thus be a common, continuous portion of hardmask 118 that extends over all of the hardmask 116. Examples of embodiments in which the hardmask 118 is not disposed over the entirety of the hardmask 116 are discussed below with reference to FIGS. 36-38 and 45. The hardmask 118 may be patterned using any of the techniques discussed above with reference to the patterning of the hardmask 116, for example.

Figure 20:
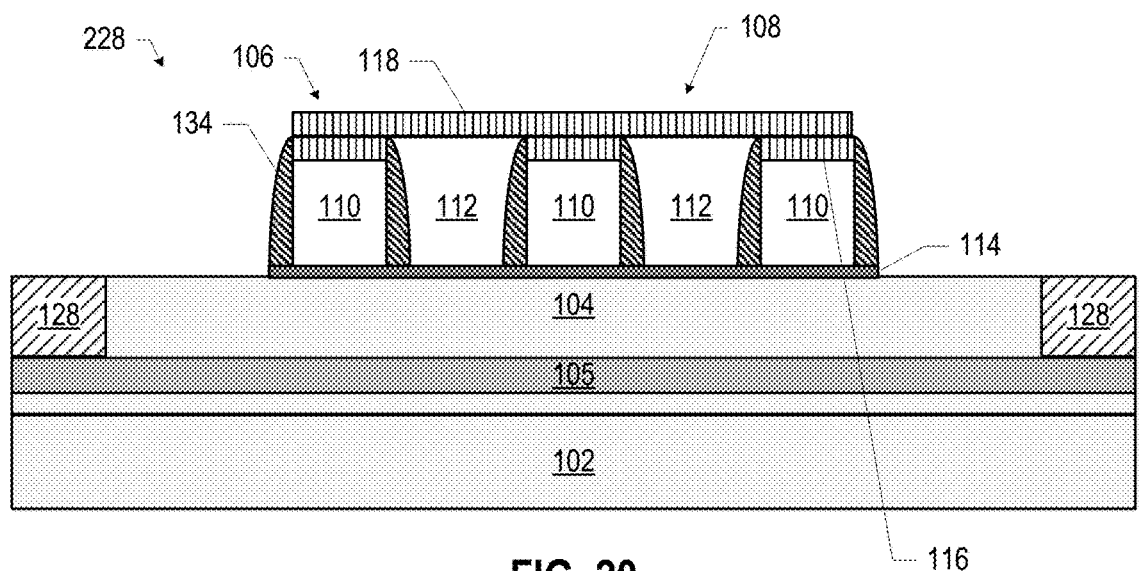

FIG. 20 is a cross-sectional view of an assembly 228 subsequent to etching the assembly 226 (FIG. 19) to remove the portions 150 that are not protected by the patterned hardmask 118 to form the gates 108. Portions of the hardmask 118 may remain on top of the hardmask 116, as shown. The operations performed on the assembly 226 may include removing any gate dielectric 114 that is "exposed" on the fin 104, as shown. The excess gate dielectric 114 may be removed using any suitable technique, such as chemical etching or silicon bombardment.

Figure 21:
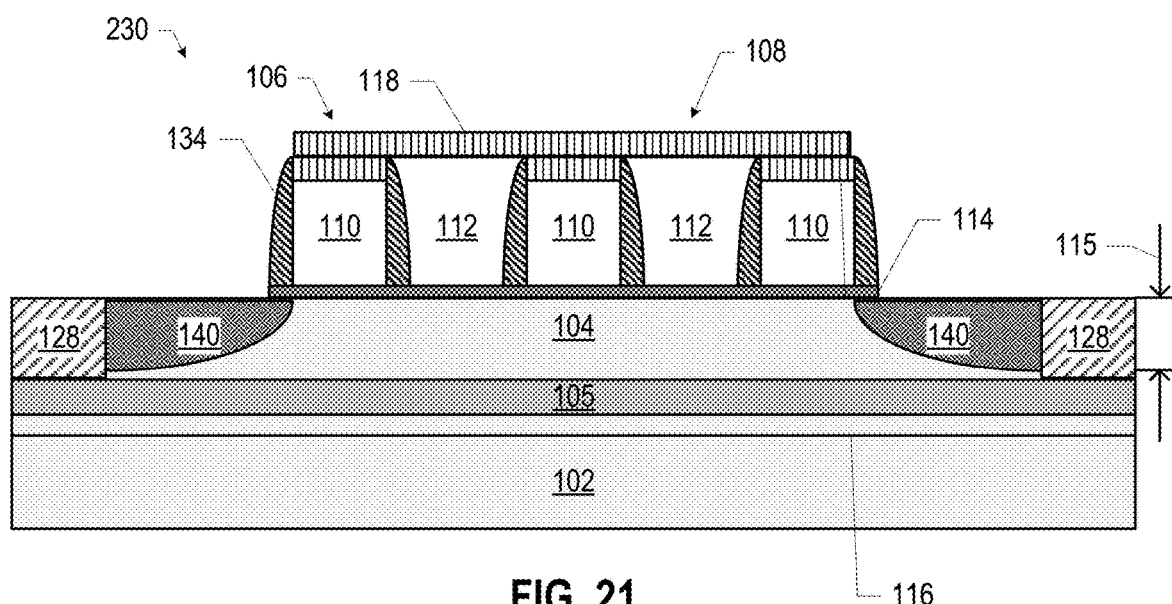

FIG. 21 is a cross-sectional view of an assembly 230 subsequent to doping the fins 104 of the assembly 228 (FIG. 20) to form doped regions 140 in the portions of the fins 104 "outside" of the gates 106/108. The doped regions may not extend all the way down in the quantum well stack to the back gate 105, and may thus be electrically isolated from the back gate 105. The type of dopant used to form the doped regions 140 may depend on the type of quantum dot desired, as discussed above. In some embodiments, the doping may be performed by ion implantation. For example, when the quantum dot 142 is to be an electron-type quantum dot 142, the doped regions 140 may be formed by ion implantation of phosphorous, arsenic, or another n-type material. When the quantum dot 142 is to be a hole-type quantum dot 142, the doped regions 140 may be formed by ion implantation of boron or another p-type material. An annealing process that activates the dopants and causes them to diffuse farther into the fins 104 may follow the ion implantation process. The depth of the doped regions 140 may take any suitable value; for example, in some embodiments, the doped regions 140 may extend into the fin 104 to a depth 115 between 500 and 1000 Angstroms.

The outer spacers 134 on the outer gates 106 may provide a doping boundary, limiting diffusion of the dopant from the doped regions 140 into the area under the gates 106/108. As shown, the doped regions 140 may extend under the adjacent outer spacers 134. In some embodiments, the doped regions 140 may extend past the outer spacers 134 and under the gate metal 110 of the outer gates 106, may extend only to the boundary between the outer spacers 134 and the adjacent gate metal 110, or may terminate under the outer spacers 134 and not reach the boundary between the outer spacers 134 and the adjacent gate metal 110. Examples of such embodiments are discussed below with reference to FIGS. 46 and 47. The recesses 107 (and the insulating material 128) that fills them may also provide a doping boundary. The doping concentration of the doped regions 140 may, in some embodiments, be between $10^{17}/cm^3$ and $10^{20}/cm^3$.

Figure 22:
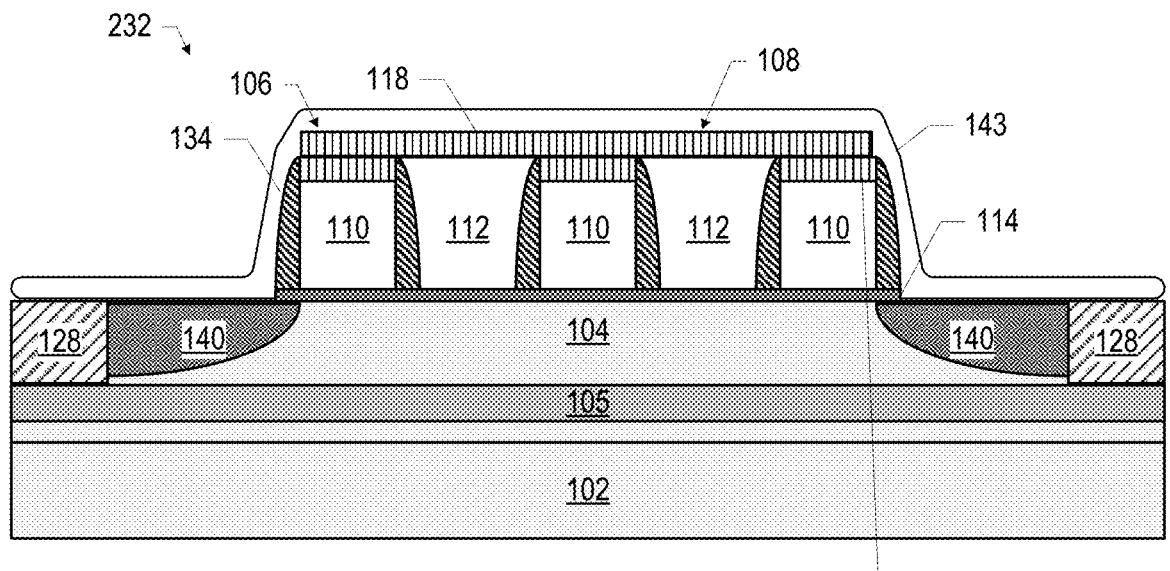

FIG. 22 is a cross-sectional side view of an assembly 232 subsequent to providing a layer of nickel or other material 143 over the assembly 230 (FIG. 21). The nickel or other material 143 may be deposited on the assembly 230 using any suitable technique (e.g., a plating technique, chemical vapor deposition, or atomic layer deposition).

Figure 23:
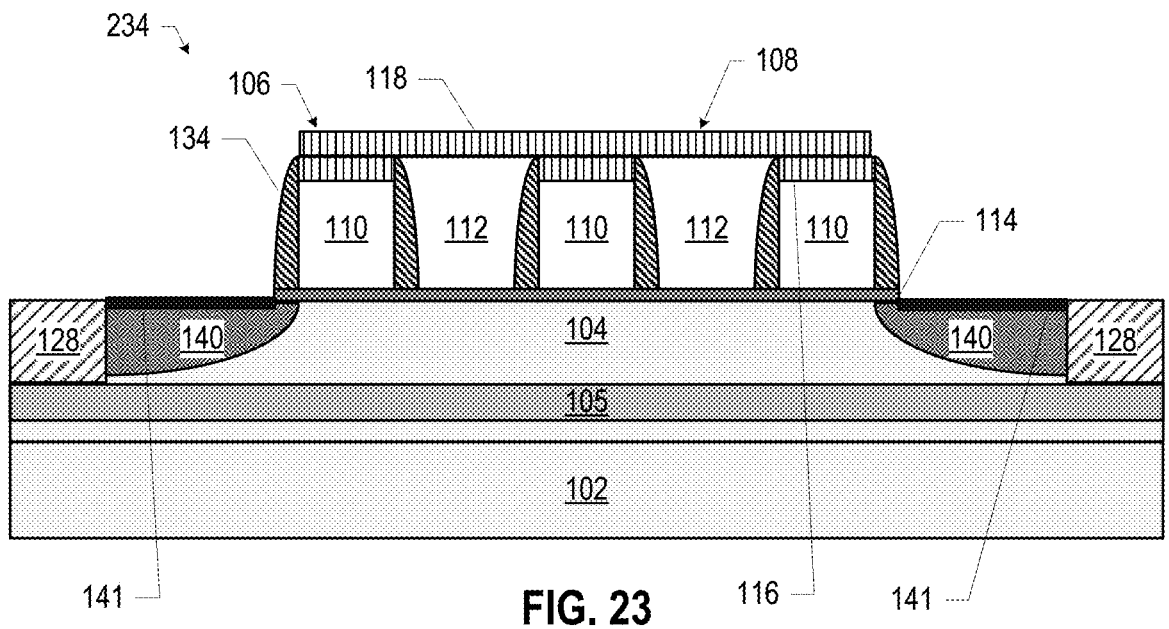

FIG. 23 is a cross-sectional side view of an assembly 234 subsequent to annealing the assembly 232 (FIG. 22) to cause the material 143 to interact with the doped regions 140 to form the interface material 141, then removing the unreacted material 143. When the doped regions 140 include silicon and the material 143 includes nickel, for example, the interface material 141 may be nickel silicide. Materials other than nickel may be deposited in the operations discussed above with reference to FIG. 22 in order to form other interface materials 141, including titanium, aluminum, molybdenum, cobalt, tungsten, or platinum, for example. More generally, the interface material 141 of the assembly 234 may include any of the materials discussed herein with reference to the interface material 141.

Figure 24:
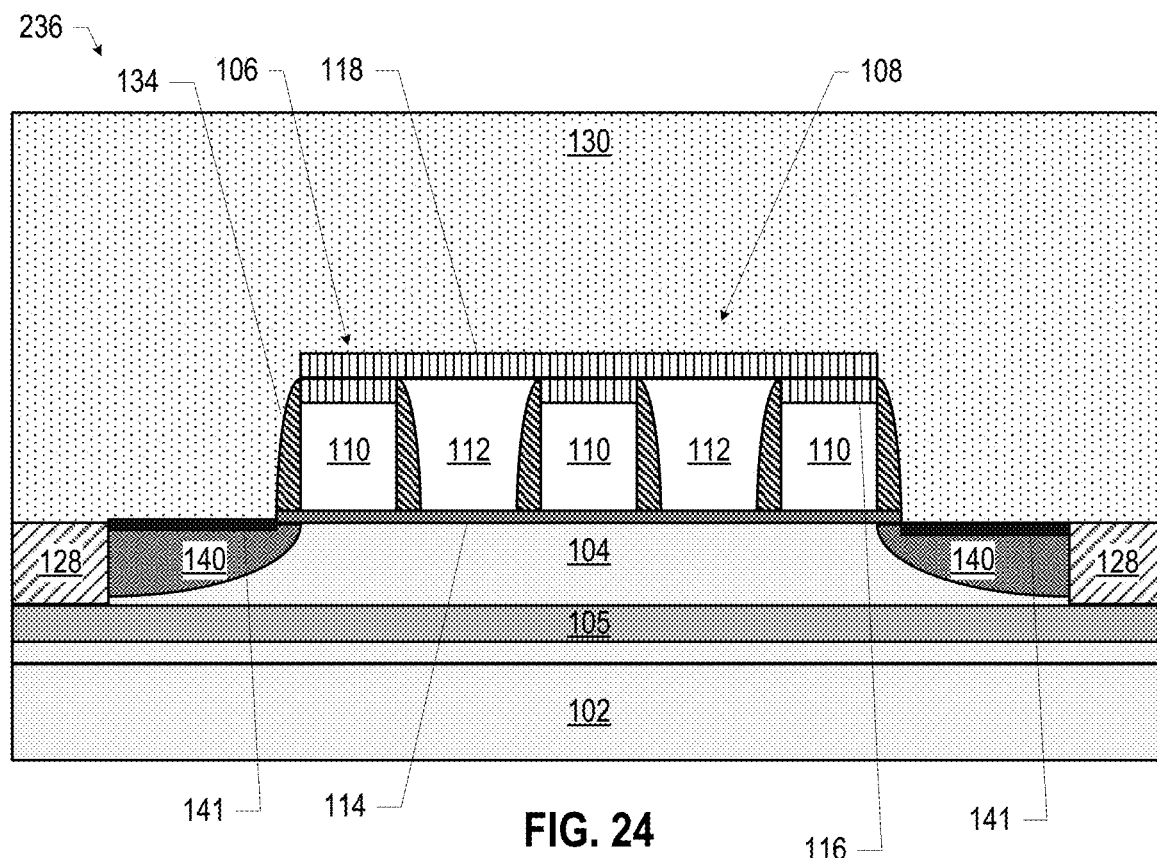

FIG. 24 is a cross-sectional view of an assembly 236 subsequent to providing an insulating material 130 on the assembly 234 (FIG. 23). The insulating material 130 may take any of the forms discussed above. For example, the insulating material 130 may be a dielectric material, such as silicon oxide. The insulating material 130 may be provided on the assembly 234 using any suitable technique, such as spin coating, chemical vapor deposition (CVD), or plasma-enhanced CVD (PECVD). In some embodiments, the insulating material 130 may be polished back after deposition, and before further processing.

Figure 25:
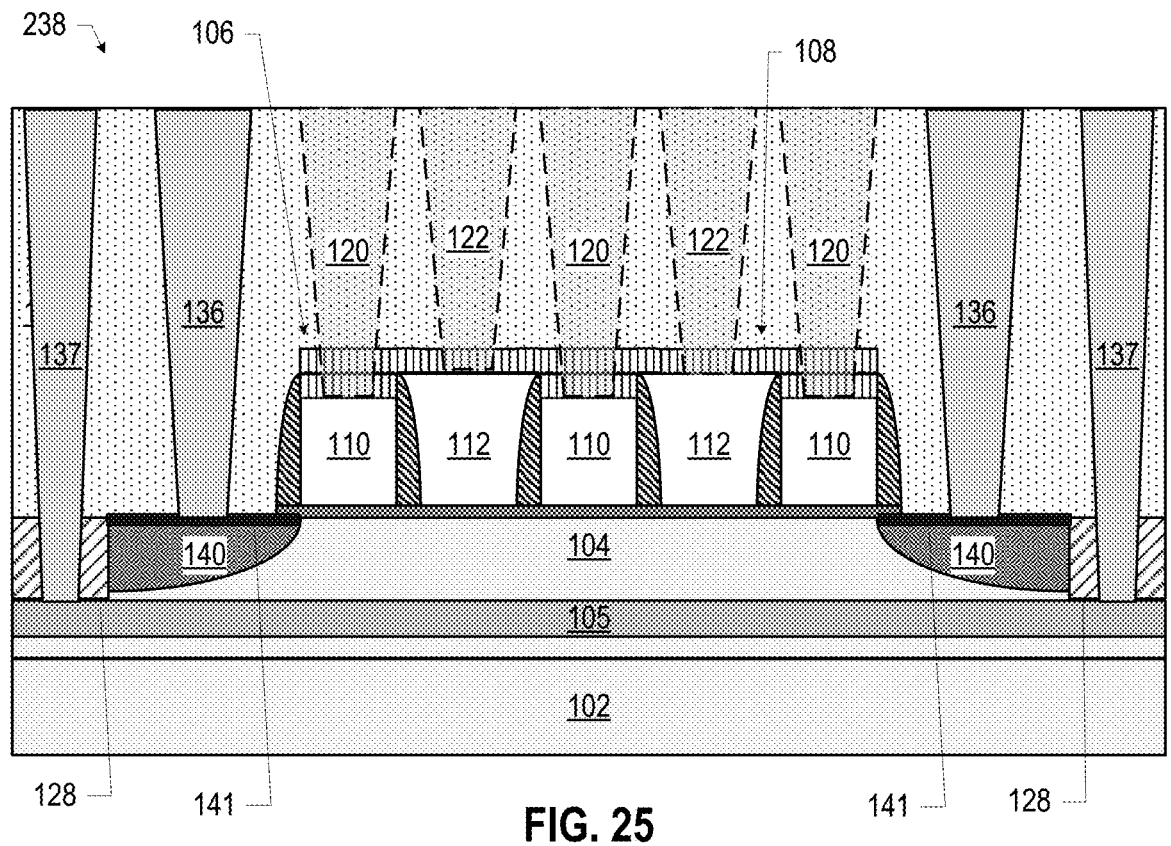

FIG. 25 is a cross-sectional view of an assembly 238 subsequent to forming, in the assembly 236 (FIG. 24), conductive vias 120 through the insulating material 130 (and the hardmasks 116 and 118) to contact the gate metal 110 of the gates 106, conductive vias 122 through the insulating material 130 (and the hardmask 118) to contact the gate metal 112 of the gates 108, conductive vias 136 through the insulating material 130 to contact the interface material 141 of the doped regions 140, and conductive vias 137 through the insulating material 130 and the insulating material 128 to contact the back gate 105. Further conductive vias and/or lines may be formed on the assembly 238 using conventional interconnect techniques, if desired. The resulting assembly 238 may take the form of the quantum dot device 100 discussed above with reference to FIGS. 1-3. In some embodiments, the assembly 236 may be planarized to remove the hardmasks 116 and 118, then additional insulating material 130 may be provided on the planarized surface before forming the conductive vias 120, 122, 136, and 137; in such an embodiment, the hardmasks 116 and 118 would not be present in the quantum dot device 100.

Figure 26:
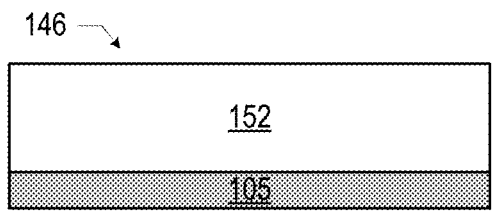
FIGS. 26-28 are cross-sectional views of various examples of quantum well stacks that may be used in a quantum dot device, in accordance with various embodiments.
Figure 27:
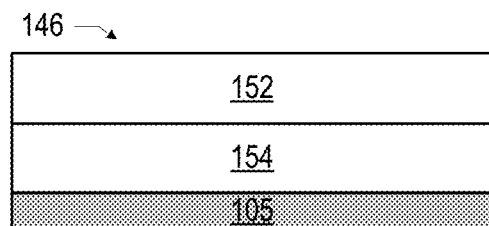
Figure 28:
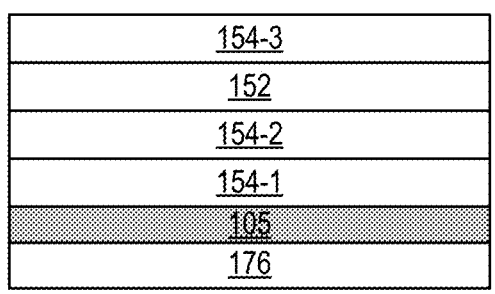

As discussed above, the base 102 and the fin 104 of a quantum dot device 100 may be formed from a substrate 144 and a quantum well stack 146 disposed on the substrate 144. The quantum well stack 146 may include a quantum well layer in which a 2DEG may form during operation of the quantum dot device 100. The quantum well stack 146 may take any of a number of forms, several of which are illustrated in FIGS. 26-28. The various layers in the quantum well stacks 146 discussed below may be grown on the substrate 144 (e.g., using epitaxial processes).

FIG. 26 is a cross-sectional view of a quantum well stack 146 including a quantum well layer 152 and a back gate 105. The back gate 105 may be disposed on the substrate 144 (e.g., as discussed above with reference to FIG. 5), and the quantum well layer 150 may be disposed on the back gate 105. The quantum well layer 152 may be formed of a material such that, during operation of the quantum dot device 100, a 2DEG may form in the quantum well layer 152 proximate to the upper surface of the quantum well layer 152 (e.g., the surface opposite to the surface in contact with the back gate 105). The gate dielectric 114 of the gates 106/108 may be disposed on the upper surface of the quantum well layer 152 (e.g., as discussed above with reference to FIG. 11). In some embodiments, the quantum well layer 152 of FIG. 26 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. The back gate 105 may be formed of doped silicon (e.g., doped with an n-type material), and the quantum well layer 152 may include a portion that acts as an intrinsic silicon barrier between the back gate 105 and the 2DEG region. Embodiments in which the quantum well layer 152 of FIG. 26 is formed of intrinsic silicon may be particularly advantageous for electron-type quantum dot devices 100. In some embodiments, the quantum well layer 152 of FIG. 26 may be formed of intrinsic germanium, and the gate dielectric 114 may be formed of germanium oxide; in such an arrangement, during use of the quantum dot device 100, a 2DEG may form in the intrinsic germanium at the interface between the intrinsic germanium and the germanium oxide. The back gate 105 may be formed of doped germanium (e.g., doped with a p-type material), and the quantum well layer 152 may include a portion that acts as an intrinsic germanium barrier between the back gate 105 and the 2DEG region. Such embodiments may be particularly advantageous for hole-type quantum dot devices 100. In some embodiments, the quantum well layer 152 may be strained, while in other embodiments, the quantum well layer 152 may not be strained.

The thicknesses (i.e., z-heights) of the layers in the quantum well stack 146 of FIG. 26 may take any suitable values. For example, in some embodiments, the thickness of the quantum well layer 152 (e.g., intrinsic silicon) may be between 0.8 and 1.2 microns. The thickness of the back gate 105 may take any suitable value (e.g., as discussed above with reference to the thickness 167). The doped regions 140 may extend into the quantum well layer 152, but may not extend into the back gate 105 (and may therefore be insulated from the back gate 105).

FIG. 27 is a cross-sectional view of a quantum well stack 146 including a quantum well layer 152, a barrier layer 154, and a back gate 105. The quantum well stack 146 may be disposed on a substrate 144 (e.g., as discussed above with reference to FIG. 5) such that the barrier layer 154 is disposed between the quantum well layer 152 and the substrate 144, and the back gate 105 is disposed between the barrier layer 154 and the substrate 144. The barrier layer 154 may provide a potential barrier between the quantum well layer 152 and the back gate 105, preventing or limiting the flow of carriers between the back gate 105 and the quantum well layer 152. As discussed above with reference to FIG. 26, the quantum well layer 152 of FIG. 27 may be formed of a material such that, during operation of the quantum dot device 100, a 2DEG may form in the quantum well layer 152 proximate to the upper surface of the quantum well layer 152. The doped regions 140 may extend into the barrier layer 154, but may not extend into the back gate 105 (and may therefore be insulated from the back gate 105).

For example, in some embodiments in which the substrate 144 is formed of silicon, the quantum well layer 152 of FIG. 27 may be formed of silicon, and the barrier layer 154 may be formed of silicon germanium. The germanium content of this silicon germanium may be 20-80% (e.g., 30%). In some embodiments in which the quantum well layer 152 is formed of germanium, the barrier layer 154 may be formed of silicon germanium (with a germanium content of 20-80% (e.g., 70%)). In such embodiments, the back gate 105 may be formed of silicon germanium, and may be doped as suitable for the type of quantum dots 152 desired (e.g., doped with an n-type or a p-type material). For an n-type quantum dot device 100, for example, the back gate 105 may be doped with an n-type dopant, such as phosphorous; for a p-type quantum dot device 100, the back gate 105 may be doped with a p-type dopant, such as boron. The back gate 105 may be doped to a degree desired to achieve a desired conductivity (e.g., $10^{18}/cm^3$-$10^{19}/cm^3$). The thicknesses (i.e., z-heights) of the layers in the quantum well stack 146 of FIG. 27 may take any suitable values. For example, in some embodiments, the thickness of the barrier layer 154 (e.g., silicon germanium) may be between 0 and 400 nanometers. In some embodiments, the thickness of the quantum well layer 152 (e.g., silicon or germanium) may be between 5 and 30 nanometers. The thickness of the back gate 105 may take any suitable value (e.g., as discussed above with reference to the thickness 167).

FIG. 28 is a cross-sectional view of a quantum well stack 146 including a quantum well layer 152, three barrier layers 154-1, 154-2, and 154-3, a back gate 105, and a buffer layer 176. The quantum well stack 146 may be disposed on the substrate 144 (e.g., as discussed above with reference to FIG. 5) such that the buffer layer 176 is disposed between the back gate 105 and the substrate 144. The barrier layer 154-1 may be disposed between the barrier layer 154-2 and the back gate 105, and the quantum well layer 152 may be disposed between the barrier layer 154-2 and the barrier layer 154-3. The barrier layers 154-2 and 154-3 may provide potential energy barriers around the quantum well layer 152, and may take the form of any of the embodiments of the barrier layer 154 discussed above with reference to FIG. 27. In some embodiments of the quantum well stack 146 of FIG. 28, the buffer layer 176 and/or the barrier layer 154-3 may be omitted.

In some embodiments of the quantum well stack 146 of FIG. 28, the buffer layer 176 may be formed of the same material as the back gate 105 (which may be the same material as the barrier layers 154), and may be present to trap defects that form in this material as it is grown on the substrate 144. In some embodiments, the buffer layer 176 may be grown under different conditions (e.g., deposition temperature or growth rate) from the back gate 105 or the barrier layers 154. In particular, the barrier layers 154 may be grown under conditions that achieve fewer defects than the buffer layer 176. In some embodiments in which the buffer layer 176 includes silicon germanium, the silicon germanium of the buffer layer 176 may have a germanium content that varies from the substrate 144 to the back gate 105; for example, the silicon germanium of the buffer layer 176 may have a germanium content that varies from zero percent at the silicon substrate 144 to a nonzero percent (e.g., 30%) at the back gate 105. The thicknesses (i.e., z-heights) of the layers in the quantum well stack 146 of FIG. 28 may take any suitable values. For example, in some embodiments, the thickness of the buffer layer 176 (e.g., silicon germanium) may be between 0.3 and 4 microns (e.g., 0.3-2 microns, or 0.5 microns). In some embodiments, the thickness of the barrier layer 154-1 (e.g., silicon germanium) may be between 0 and 400 nanometers. In some embodiments, the thickness of the barrier layer 154-2 (e.g., silicon germanium) may be between 0 and 400 nanometers (e.g., between 5 and 70 nanometers). In some embodiments, the thickness of the quantum well layer 152 (e.g., silicon or germanium) may be between 5 and 30 nanometers (e.g., 10 nanometers). In some embodiments, the thickness of the barrier layer 154-3 (e.g., silicon germanium) may be between 25 and 75 nanometers (e.g., 32 nanometers). The thickness of the back gate 105 may take any suitable value (e.g., as discussed above with reference to the thickness 167). The doped regions 140 may extend into the barrier layer 154-2 (and may also extend into the barrier layer 154-1), but may not extend into the back gate 105 (and may therefore be insulated from the back gate 105).

As discussed above with reference to FIG. 27, the quantum well layer 152 of FIG. 28 may be formed of a material such that, during operation of the quantum dot device 100, a 2DEG may form in the quantum well layer 152 proximate to the upper surface of the quantum well layer 152. For example, in some embodiments in which the substrate 144 is formed of silicon, the quantum well layer 152 of FIG. 28 may be formed of silicon, and the back gate 105, the barrier layers 154, and the buffer layer 176 may be formed of silicon germanium. In some such embodiments, the silicon germanium of the buffer layer 176 may have a germanium content that varies from the substrate 144 to the back gate 105; for example, the silicon germanium of the buffer layer 176 may have a germanium content that varies from zero percent at the silicon substrate 144 to a nonzero percent (e.g., 30%) at the back gate 105. The back gate 105 may in turn have a germanium content equal to the nonzero percent. In other embodiments, the buffer layer 176 may have a germanium content equal to the germanium content of the back gate 105, but may be thicker than the barrier layer 154-1 so as to absorb the defects that arise during growth. The back gate 105 may be a doped material (e.g., doped silicon germanium) so as to be conductive during operation of the quantum dot device 100.

In some embodiments, the quantum well layer 152 of FIG. 28 may be formed of germanium, and the buffer layer 176 and the back gate 105 may be formed of silicon germanium. In some such embodiments, the silicon germanium of the buffer layer 176 may have a germanium content that varies from the substrate 144 to the back gate 105; for example, the silicon germanium of the buffer layer 176 may have a germanium content that varies from zero percent at the substrate 144 to a nonzero percent (e.g., 70%) at the back gate 105. The back gate 105 may in turn have a germanium content equal to the nonzero percent. In other embodiments, the buffer layer 176 may have a germanium content equal to the germanium content of the back gate 105 but may be thicker than the back gate 105 so as to absorb the defects that arise during growth.

In the embodiment of FIG. 28, the barrier layers 154-2 and 154-3 may provide potential energy barriers around the quantum well layer 152 (to constrain carriers to the quantum well layer 152) and the barrier layer 154-1 may provide an extra potential energy barrier between the back gate 105 and the barrier layer 154-2. Having an extra barrier layer 154-1 between the barrier layer 154-2 and the back gate 105 may reduce carrier leakage during operation, and thus improve performance. In embodiments in which the back gate 105 and the barrier layer 154-2 are formed of silicon germanium, the barrier layer 154-1 may provide this extra potential barrier by having a germanium content greater than the germanium content of the back gate 105 and the barrier layer 154-2. For example, the back gate 105 may be formed of (doped) silicon germanium with a germanium content of 30%, the barrier layer 154-2 may be formed of silicon germanium with a germanium content of 30%, and the barrier layer 154-1 may be formed of silicon germanium with a germanium content of 70%. In some such embodiments, the buffer layer 176 and the barrier layer 154-3 may be formed of silicon germanium with a germanium content of 30%, and the quantum well layer 152 may be formed of silicon. The thicknesses of the elements in the quantum well stack of FIG. 28 may take any suitable values. For example, the thickness of the barrier layer 154-1 and the barrier layer 154-2 may be selected to separate the back gate 105 and the quantum well layer 152 by a distance between 50 and 150 nanometers (e.g., between 5 and 70 nanometers, between 75 and 125 nanometers, or equal to 100 nanometers).

Embodiments in which the back gate 105 is provided by a doped version of the material of the buffer layer 176 and the barrier layer 154-1 (or the barrier layer 154-2, if the barrier layer 154-1 is omitted) may provide performance benefits by mitigating defects due to lattice mismatch that might otherwise occur during growth of the quantum well stack 146. In embodiments in which the back gate 105 is provided by a metal, the presence of the metal will disrupt the regular lattice spacing that would otherwise be present between the buffer layer 176 and the barrier layer 154-1 (or the barrier layer 154-2, if the barrier layer 154-1 is omitted). In embodiments in which the back gate 105 is provided by a doped version of the material of the buffer layer 176 and the barrier layer 154-1 (or the barrier layer 154-2, if the barrier layer 154-1 is omitted), substantial continuity in the lattice spacing may be achieved across the buffer layer 176, the back gate 105, and the barrier layers 154-1/154-2. This continuity may reduce the presence of scattering or recombination sites that arise due to lattice mismatches, and thus improve performance.

The substrate 144 and the quantum well stack 146 may be distributed between the base 102 and the fins 104 of the quantum dot device 100, as discussed above. This distribution may occur in any of a number of ways. For example, FIGS. 29-35 illustrate example base/fin arrangements 158 that may be used in a quantum dot device 100, in accordance with various embodiments.

Figure 29:
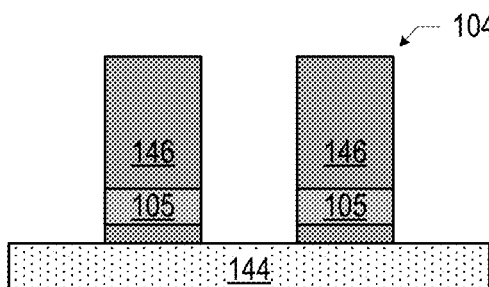
FIGS. 29-35 illustrate example base/fin arrangements that may be used in a quantum dot device, in accordance with various embodiments.

In the base/fin arrangement 158 of FIG. 29, the quantum well stack 146 (including a back gate 105) may be included in the fins 104, but not in the base 102. The substrate 144 may be included in the base 102, but not in the fins 104. When the base/fin arrangement 158 of FIG. 29 is used in the manufacturing operations discussed with reference to FIGS. 5-6, the fin etching may etch through the quantum well stack 146, and stop when the substrate 144 is reached.

Figure 30:
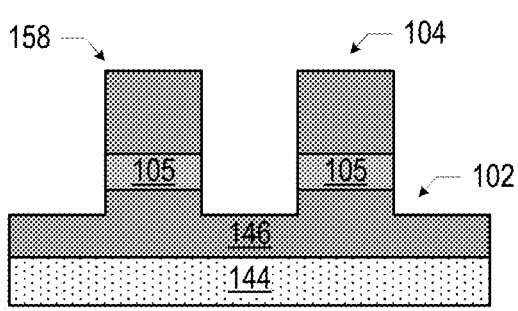
Figure 31:
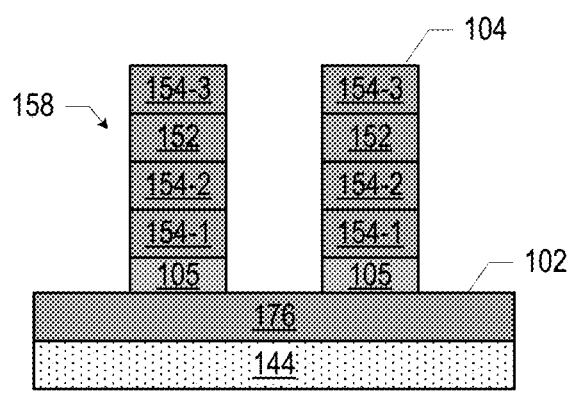

In the base/fin arrangement 158 of FIG. 30, the quantum well stack 146 (including a back gate 105) may be included in the fins 104, as well as in a portion of the base 102. A substrate 144 may be included in the base 102 as well, but not in the fins 104. When the base/fin arrangement 158 of FIG. 30 is used in the manufacturing operations discussed with reference to FIGS. 5-6, the fin etching may etch partially through the quantum well stack 146, and stop before the substrate 144 is reached. FIG. 31 illustrates a particular embodiment of the base/fin arrangement 158 of FIG. 30. In the embodiment of FIG. 31, the quantum well stack 146 of FIG. 28 is used; the fins 104 include the back gate 105, the barrier layers 154-1 and 154-2, the quantum well layer 152, and the barrier layer 154-3, while the base 102 includes the buffer layer 176 and the substrate 144.

Figure 32:
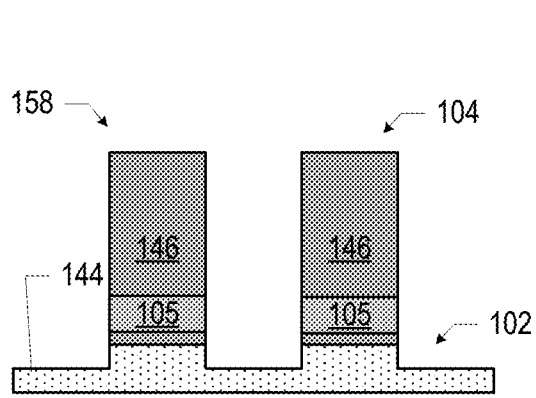
Figure 33:
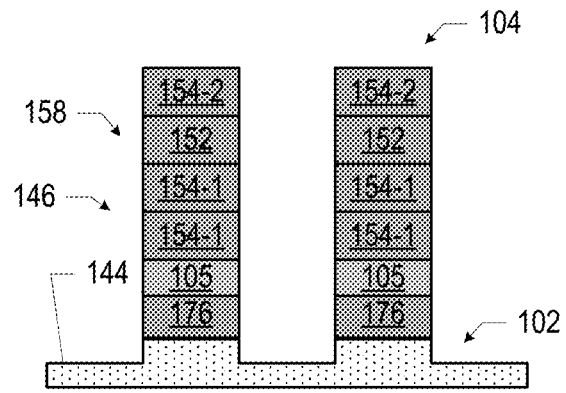

In the base/fin arrangement 158 of FIG. 32, the quantum well stack 146 (including a back gate 105) may be included in the fins 104, but not the base 102. The substrate 144 may be partially included in the fins 104, as well as in the base 102. When the base/fin arrangement 158 of FIG. 32 is used in the manufacturing operations discussed with reference to FIGS. 5-6, the fin etching may etch through the quantum well stack 146 and into the substrate 144 before stopping. FIG. 33 illustrates a particular embodiment of the base/fin arrangement 158 of FIG. 32. In the embodiment of FIG. 33, the quantum well stack 146 of FIG. 28 is used; the fins 104 include the quantum well stack 146 and a portion of the substrate 144, while the base 102 includes the remainder of the substrate 144.

Figure 34:
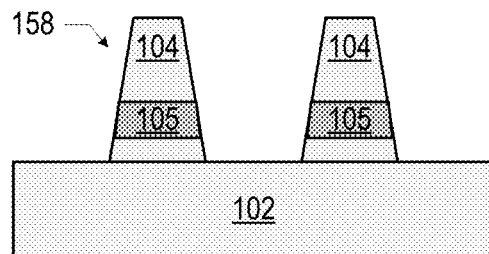
Figure 35:
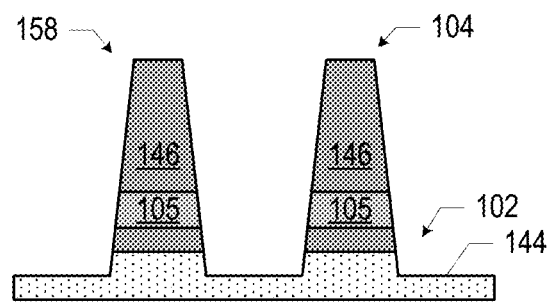

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 34, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 34. FIG. 35 illustrates a particular embodiment of the base/fin arrangement 158 of FIG. 34. In FIG. 35, the quantum well stack 146 (including a back gate 105) is included in the tapered fins 104 while a portion of the substrate 144 is included in the tapered fins and a portion of the substrate 144 provides the base 102.

Figure 36:
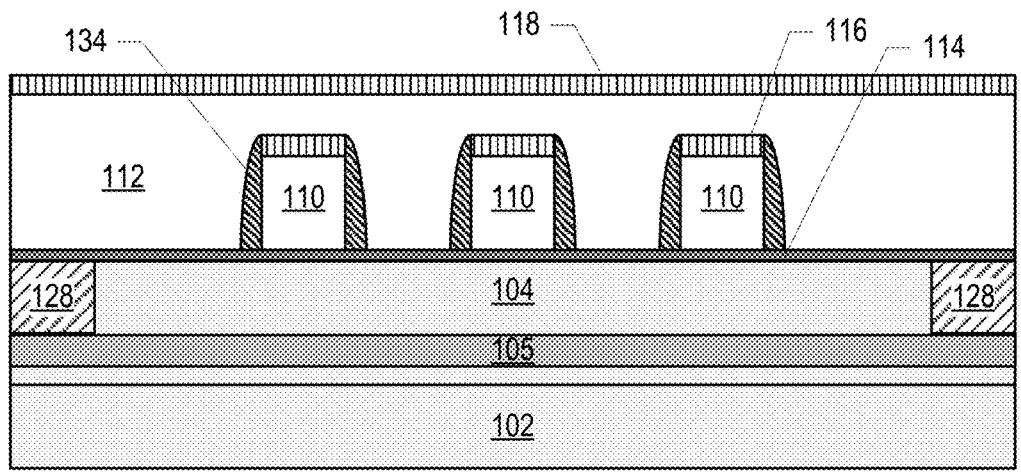
FIGS. 36-38 illustrate various example stages in the manufacture of alternative gate arrangements that may be included in a quantum dot device, in accordance with various embodiments.
Figure 37:
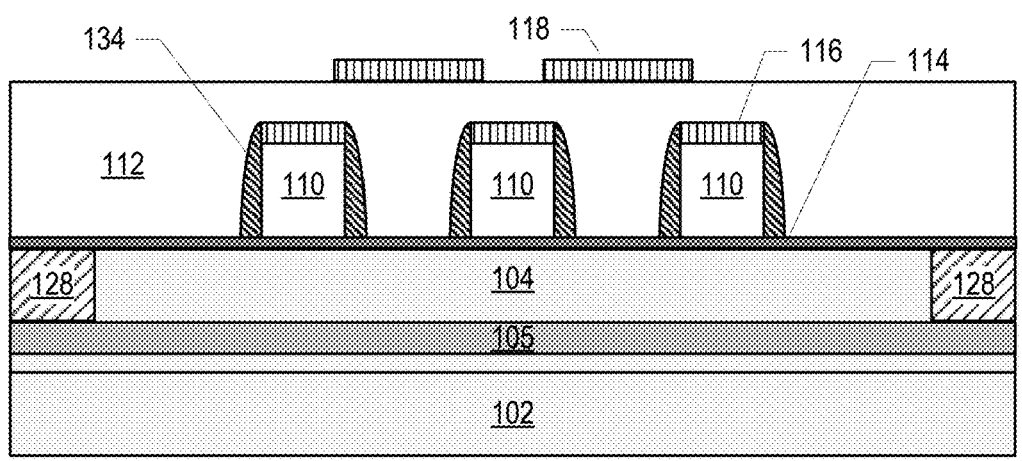
Figure 38:
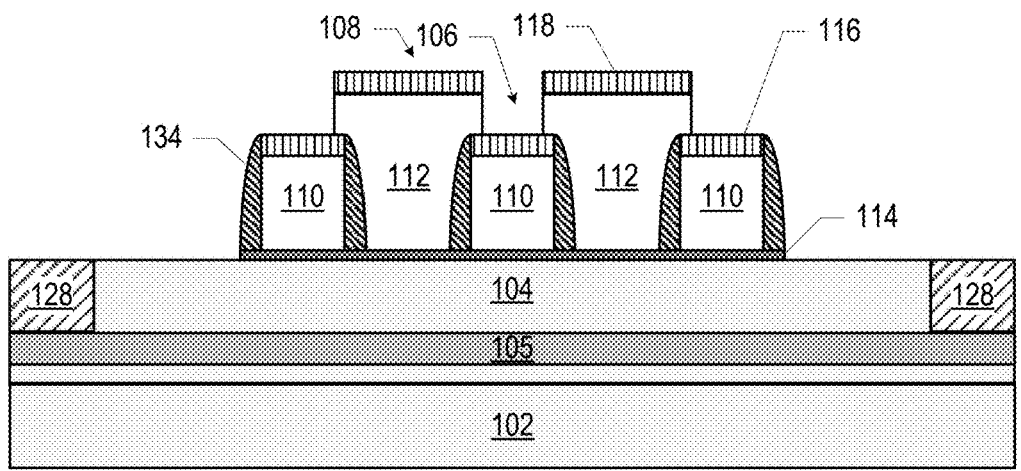

In the embodiment of the quantum dot device 100 illustrated in FIG. 2, the z-height of the gate metal 112 of the gates 108 may be approximately equal to the sum of the z-height of the gate metal 110 and the z-height of the hardmask 116, as shown. Also in the embodiment of FIG. 2, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction. FIGS. 36-38 illustrate various example stages in the manufacture of alternative gate arrangements that may be included in a quantum dot device 100, in accordance with various embodiments.

FIG. 36 illustrates an assembly 242 subsequent to providing the gate metal 112 and a hardmask 118 on the assembly 218 (FIG. 15). The assembly 242 may be similar to the assembly 224 of FIG. 18 (and may be formed using any of the techniques discussed above with reference to FIGS. 16-18), but may include additional gate metal 112 between the hardmask 116 and the hardmask 118, of any desired thickness. In some embodiments, the gate metal 112 may be planarized prior to provision of the hardmask 118, but the hardmask 118 may still be spaced away from the hardmask 116 in the z-direction by the gate metal 112, as shown in FIG. 36.

FIG. 37 illustrates an assembly 244 subsequent to patterning the hardmask 118 of the assembly 242 (FIG. 36). The pattern applied to the hardmask 118 may include the locations for the gates 108, as discussed below. The hardmask 118 may be non-coplanar with the hardmask 116, as illustrated in FIG. 36, and may extend "over" at least a portion of the hardmask 116 (and thus over the gate metal 110 of the gates 106).

FIG. 38 illustrates an assembly 246 subsequent to etching the assembly 244 (FIG. 37) to remove the portions 150 that are not protected by the patterned hardmask 118 to form the gates 108. The gate metal 112 of the gates 106 may extend "over" the hardmask 116 of the gates 108, and may be electrically insulated from the gate metal 110 by the hardmask 116. In the embodiment illustrated in FIG. 38, the z-height of the gate metal 112 of the gates 108 may be greater than the sum of the z-height of the gate metal 110 and the z-height of the hardmask 116 of the gates 106. Additionally, the gate metal 112 of the gates 108 may extend beyond the spacers 134 in the x-direction, as shown. Further manufacturing operations may be performed on the assembly 246, as discussed above with reference to FIGS. 21-25.

Figure 39:
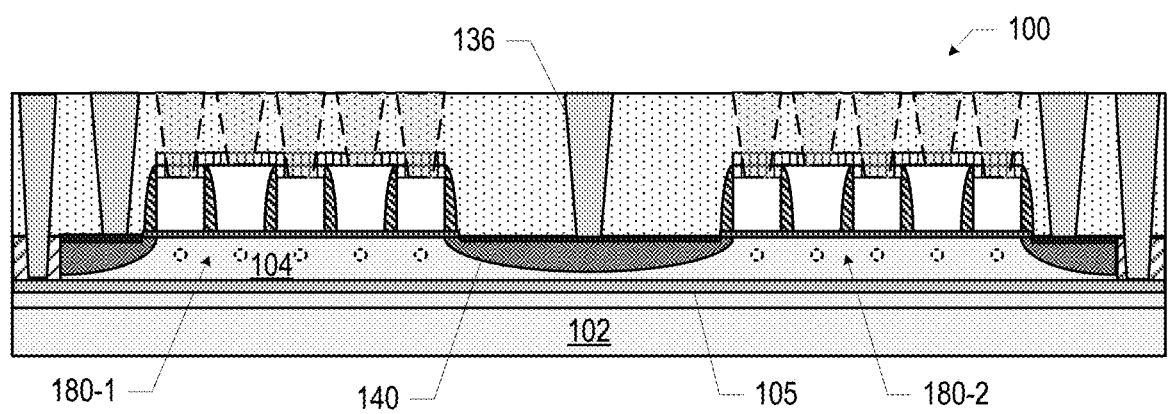
FIG. 39 illustrates an embodiment of a quantum dot device having multiple groups of gates on a single fin, in accordance with various embodiments.

As noted above, a single fin 104 may include multiple groups of gates 106/108, spaced apart along the fin by a doped region 140. FIG. 39 is a cross-sectional view of an example of such a quantum dot device 100 having multiple groups of gates 180 on a single fin 104, in accordance with various embodiments. Each of the groups 180 may include gates 106/108 (not labeled in FIG. 39 for ease of illustration) that may take the form of any of the embodiments of the gates 106/108 discussed herein. A doped region 140 (and its interface material 141) may be disposed between two adjacent groups 180 (labeled in FIG. 39 as groups 180-1 and 180-2), and may provide a common reservoir for both groups 180. In some embodiments, this "common" doped region 140 may be electrically contacted by a single conductive via 136. In the embodiment illustrated in FIG. 39, a single back gate 105 may extend across the device and may be disposed "under" multiple groups of gates 1808; in other embodiments, separate back gates 105 may be used "under" one or more groups of gates 108. The particular number of gates 106/108 illustrated in FIG. 39, and the particular number of groups 180, is simply illustrative, and a fin 104 may include any suitable number of gates 106/108 arranged in any suitable number of groups 180.

As discussed above with reference to FIGS. 1-3, in some embodiments in which the gate dielectric 114 is not a layer shared commonly between the gates 108 and 106, but instead is separately deposited on the fin 104 between the spacers 134, the gate dielectric 114 may extend at least partially up the sides of the spacers 134, and the gate metal 112 may extend between the portions of gate dielectric 114 on the spacers 134. FIGS. 40-44 illustrate various alternative stages in the manufacture of such an embodiment of a quantum dot device 100, in accordance with various embodiments. In particular, the operations illustrated in FIGS. 40-44 may take the place of the operations illustrated in FIGS. 13-15.

Figure 40:
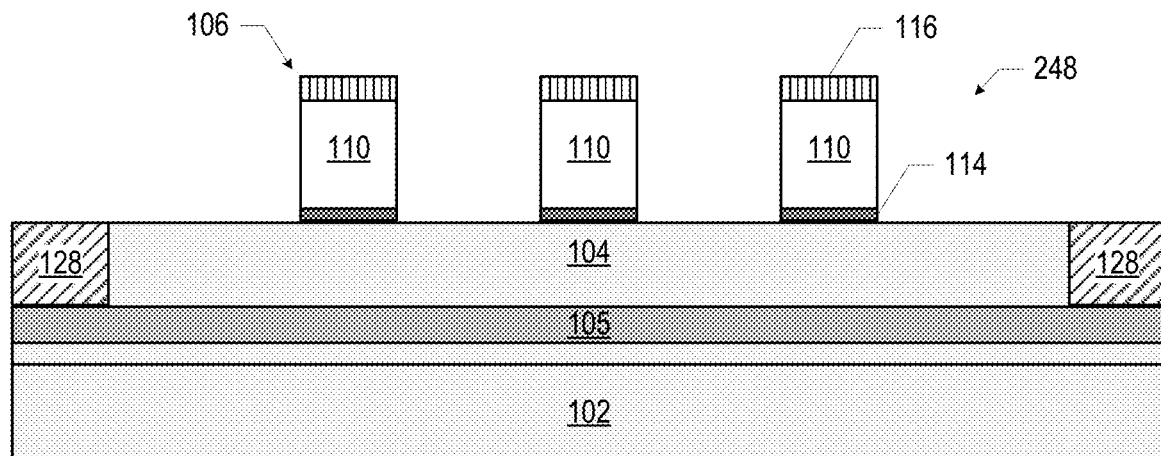
FIGS. 40-44 illustrate various alternative stages in the manufacture of a quantum dot device, in accordance with various embodiments.

FIG. 40 is a cross-sectional view of an assembly 248 subsequent to etching the assembly 212 (FIG. 12) to remove the gate metal 110, and the gate dielectric 114 that is not protected by the patterned hardmask 116, to form the gates 106.

Figure 41:
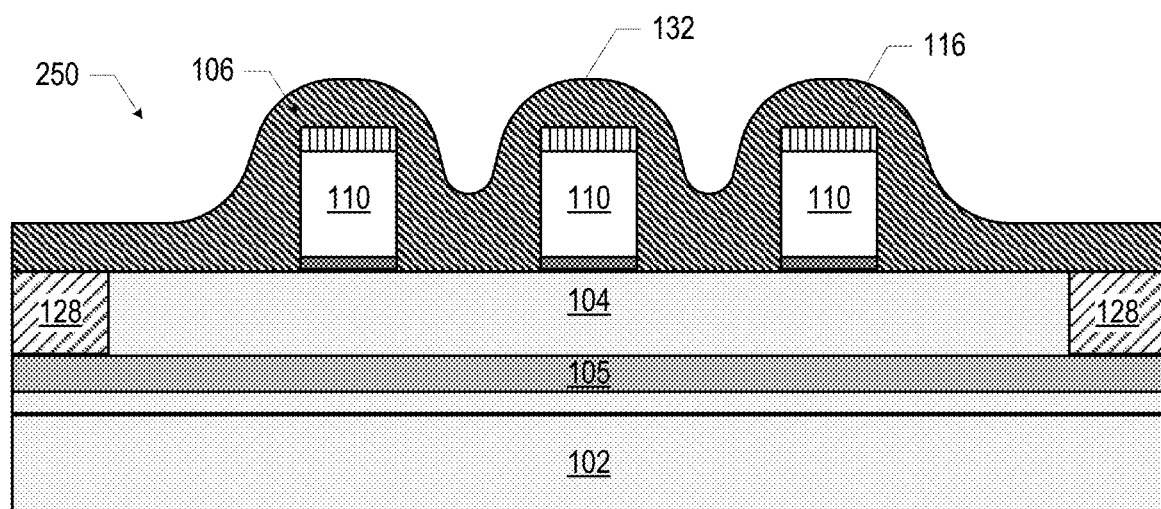

FIG. 41 is a cross-sectional view of an assembly 250 subsequent to providing spacer material 132 on the assembly 248 (FIG. 40). The deposition of the spacer material 132 may take any of the forms discussed above with reference to FIG. 14, for example.

Figure 42:
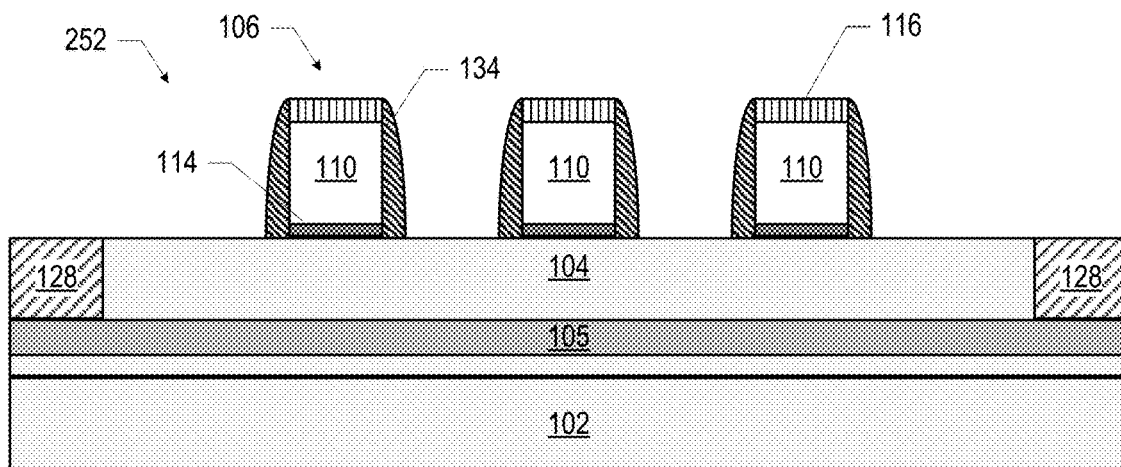

FIG. 42 is a cross-sectional view of an assembly 252 subsequent to etching the spacer material 132 of the assembly 250 (FIG. 41), leaving spacers 134 formed of the spacer material 132 on the sides of the gates 106 (e.g., on the sides of the hardmask 116, the gate metal 110, and the gate dielectric 114). The etching of the spacer material 132 may take any of the forms discussed above with reference to FIG. 15, for example.

Figure 43:
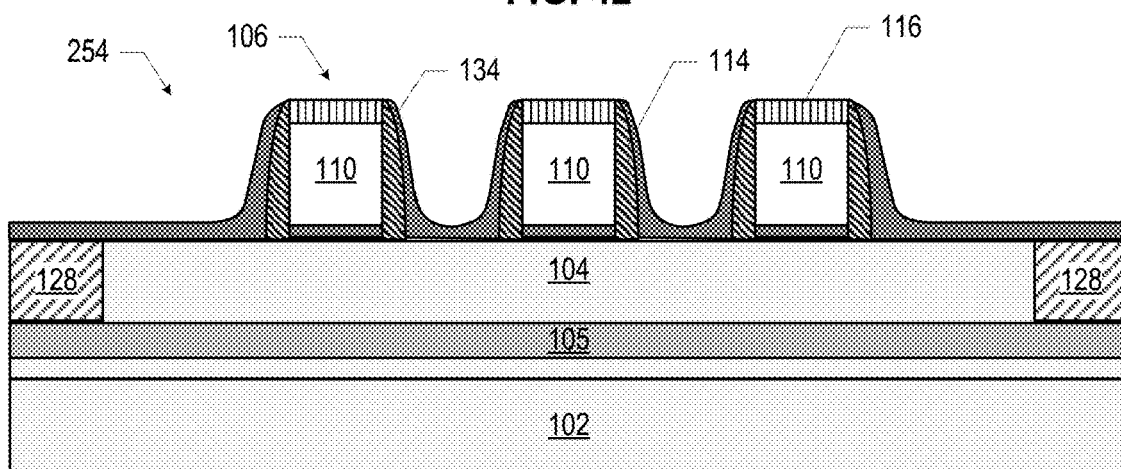

FIG. 43 is a cross-sectional view of an assembly 254 subsequent to providing a gate dielectric 114 on the fin 104 between the gates 106 of the assembly 252 (FIG. 42). In some embodiments, the gate dielectric 114 provided between the gates 106 of the assembly 252 may be formed by atomic layer deposition (ALD) and, as illustrated in FIG. 43, may cover the exposed fin 104 between the gates 106, and may extend onto the adjacent spacers 134.

Figure 44:
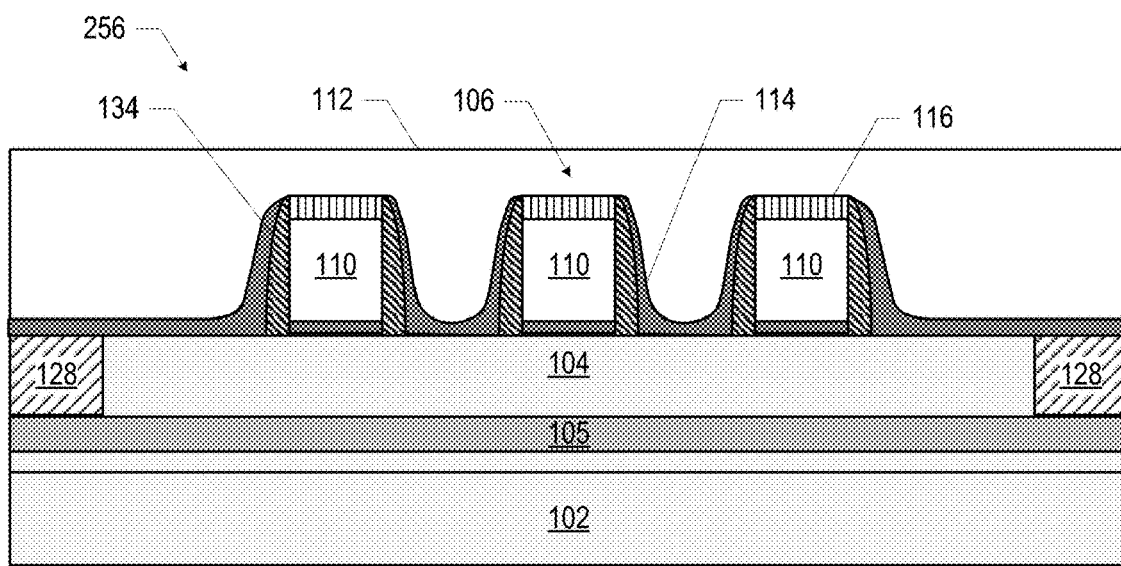

FIG. 44 is a cross-sectional view of an assembly 256 subsequent to providing the gate metal 112 on the assembly 254 (FIG. 43). The gate metal 112 may fill the areas between adjacent ones of the gates 106, and may extend over the tops of the gates 106, as shown. The provision of the gate metal 112 may take any of the forms discussed above with reference to FIG. 16, for example. The assembly 256 may be further processed as discussed above with reference to FIGS. 17-25.

Figure 45:
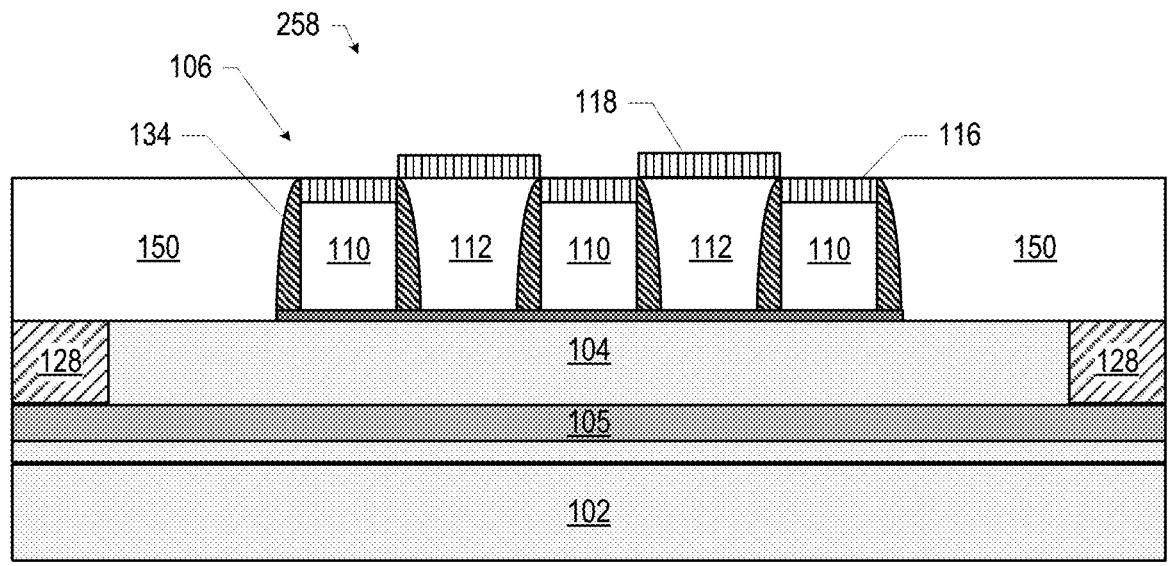
FIG. 45 illustrates an example alternative stage in the manufacture of a quantum dot device, in accordance with various embodiments.

As discussed above with reference to FIG. 19, in some embodiments, the pattern applied to the hardmask 118 (used for patterning the gates 108) may not result in a common, continuous portion of hardmask 118 that extends over all of the hardmask 116. One such example was discussed above with reference to FIGS. 36-38, and another example of such an embodiment is illustrated in FIG. 45. In particular, FIG. 45 is a cross-sectional view of an assembly 258 in which the hardmask 118 of the assembly 224 (FIG. 18) is not patterned to extend over the gates 106, but instead is patterned so as not to extend over the gate metal 110. The assembly 258 may be further processed as discussed above with reference to FIGS. 20-25 (e.g., etching away the excess portions 150, etc.). In some embodiments, the hardmasks 116 and 118 may remain in the quantum dot device 100 as part of the gates 106/108, while in other embodiments, the hardmasks 116 and 118 may be removed.

Figures 46, 47:
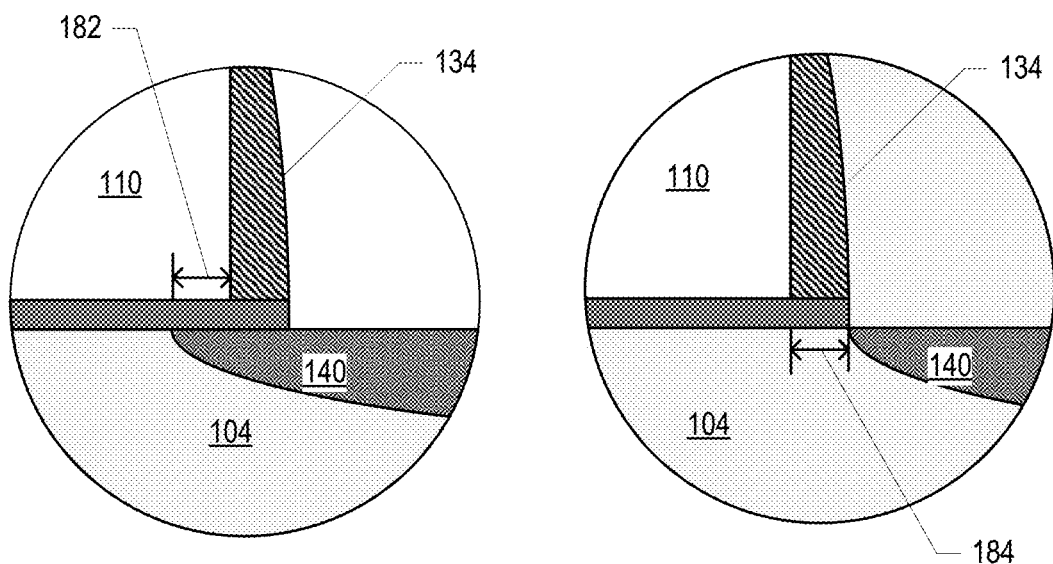
FIGS. 46-47 illustrate detail views of various embodiments of a doped region in a quantum dot device.

As discussed above with reference to FIGS. 2 and 21, the outer spacers 134 on the outer gates 106 may provide a doping boundary, limiting diffusion of the dopant from the doped regions 140 into the area under the gates 106/108. In some embodiments, the doped regions 140 may extend past the outer spacers 134 and under the outer gates 106. For example, as illustrated in FIG. 46, the doped region 140 may extend past the outer spacers 134 and under the outer gates 106 by a distance 182 between 0 and 10 nanometers. In some embodiments, the doped regions 140 may not extend past the outer spacers 134 toward the outer gates 106, but may instead "terminate" under the outer spacers 134. For example, as illustrated in FIG. 47, the doped regions 140 may be spaced away from the interface between the outer spacers 134 and the outer gates 106 by a distance 184 between 0 and 10 nanometers. The interface material 141 is omitted from FIGS. 46 and 47 for ease of illustration.

Figures 48, 49:
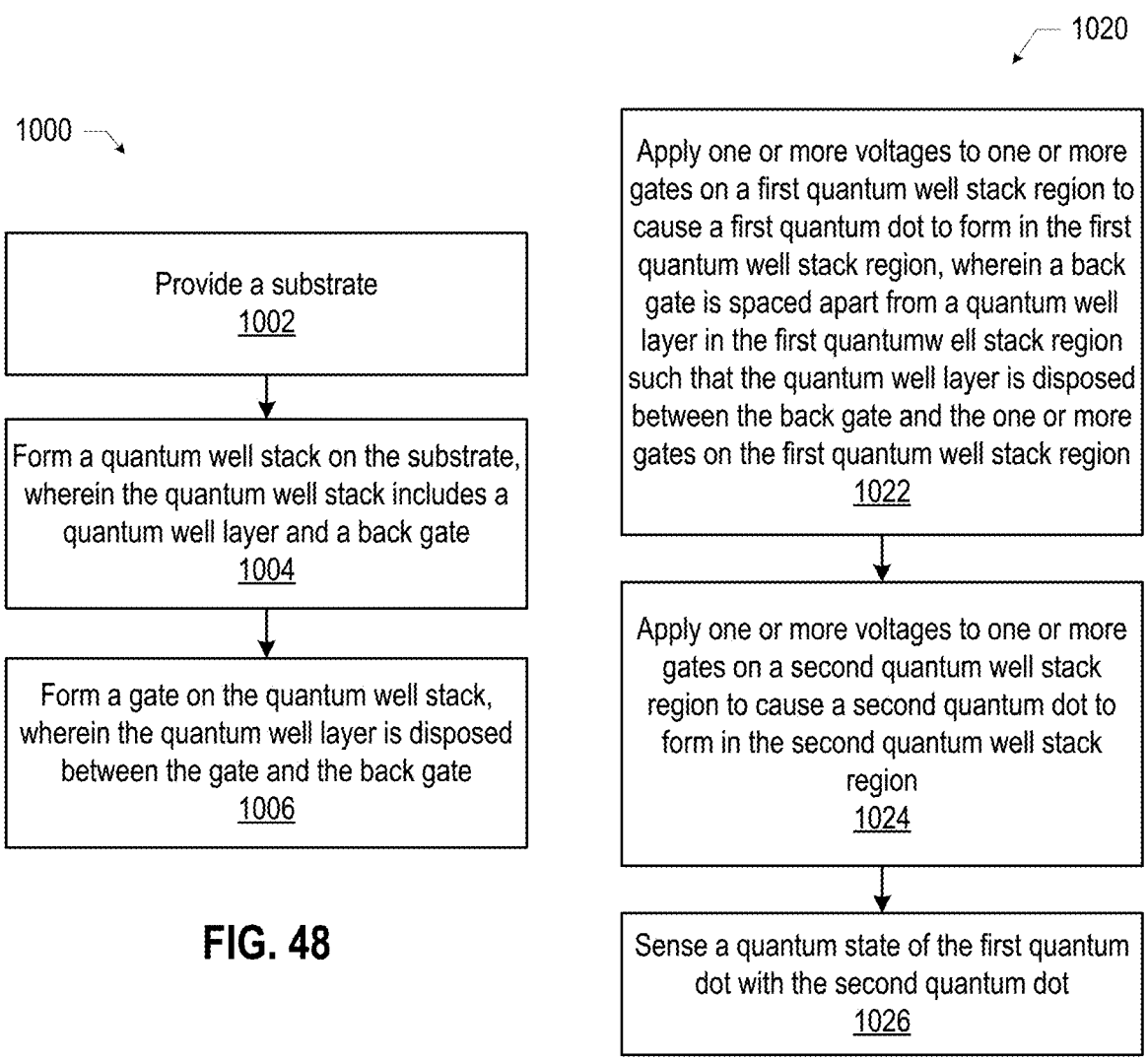

As noted above, any suitable techniques may be used to manufacture the quantum dot devices 100 disclosed herein. FIG. 48 is a flow diagram of an illustrative method 1000 of manufacturing a quantum dot device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable quantum dot device (including any suitable ones of the embodiments disclosed herein).

At 1002, a substrate may be provided. For example, a substrate 144 may be provided (e.g., as discussed above with reference to FIG. 4).

At 1004, a quantum well stack may be formed on the substrate. The quantum well stack may include a quantum well layer and a back gate. For example, a quantum well stack 146 including a quantum well layer 152 and a back gate 105 may be provided on a substrate 144 (e.g., as discussed above with reference to FIGS. 4-5 and 26-28).

At 1006, a gate may be formed on the quantum well stack. The quantum well layer may be disposed between the gate and the back gate. For example, multiple gates 106/108 may be formed (e.g., as discussed above with reference to FIGS. 11-20).

A number of techniques are disclosed herein for operating a quantum dot device 100. FIGS. 49-50 are flow diagrams of particular illustrative methods 1020 and 1040, respectively, of operating a quantum dot device, in accordance with various embodiments. Although the operations discussed below with reference to the methods 1020 and 1040 are illustrated in a particular order and depicted once each, these operations may be repeated or performed in a different order (e.g., in parallel), as suitable. Additionally, various operations may be omitted, as suitable. Various operations of the methods 1020 and 1040 may be illustrated with reference to one or more of the embodiments discussed above, but the methods 1020 and 1040 may be used to operate any suitable quantum dot device (including any suitable ones of the embodiments disclosed herein).

Turning to the method 1020 of FIG. 49, at 1022, one or more voltages may be applied to one or more gates on a first quantum well stack region to cause a first quantum dot to form in the first quantum well stack region. The first quantum well stack region may include a back gate spaced apart from a quantum well layer in the first quantum well stack region, and the quantum well layer may be disposed between the back gate and the one or more gates. For example, one or more voltages may be applied to the gates 106/108 on a fin 104-1 to cause at least one quantum dot 142 to form in the fin 104-1. A back gate 105 may be spaced apart from a quantum well layer 152, and the quantum well layer 152 may be disposed between the gates 106/108 and the back gate 105.

At 1024, one or more voltages may be applied to one or more gates on a second quantum well stack region to cause a second quantum dot to form in the second quantum well stack region. For example, one or more voltages may be applied to the gates 106/108 on a fin 104-2 to cause at least one quantum dot 142 to form in the fin 104-2.

At 1026, a quantum state of the first quantum dot may be sensed with the second quantum dot. For example, a quantum dot 142 in the fin 104-2 (the "read" fin) may sense the quantum state of a quantum dot 142 in the fin 104-1 (the "active" fin).

Turning to the method 1040 of FIG. 50, at 1042, a voltage may be applied to a first gate disposed on a quantum well stack region to cause a first quantum dot to form in a first quantum well in the quantum well stack region under the first gate. A back gate may be disposed in the quantum well stack region. For example, a voltage may be applied to the gate 108-1 disposed on a fin 104 to cause a first quantum dot 142 to form in the quantum well layer 152 in the fin 104 under the gate 108-1. A back gate 105 may be disposed in the fin 104.

At 1044, a voltage may be applied to a second gate disposed on the quantum well stack region to cause a second quantum dot to form in a second quantum well in the quantum well stack region under the second gate. For example, a voltage may be applied to the gate 108-2 disposed on the fin 104 to cause a second quantum dot 142 to form in the quantum well layer 152 in the fin 104 under the gate 108-2.

At 1046, a voltage may be applied to a third gate disposed on the fi quantum well stack region n to (1) cause a third quantum dot to form in a third quantum well in the quantum well stack region under the third gate or (2) provide a potential barrier between the first quantum well and the second quantum well. For example, a voltage may be applied to the gate 106-2 to (1) cause a third quantum dot 142 to form in the quantum well layer 152 in the fin 104 (e.g., when the gate 106-2 acts as a "plunger" gate) or (2) provide a potential barrier between the first quantum well (under the gate 108-1) and the second quantum well (under the gate 108-2) (e.g., when the gate 106-2 acts as a "barrier" gate).

Figure 51:
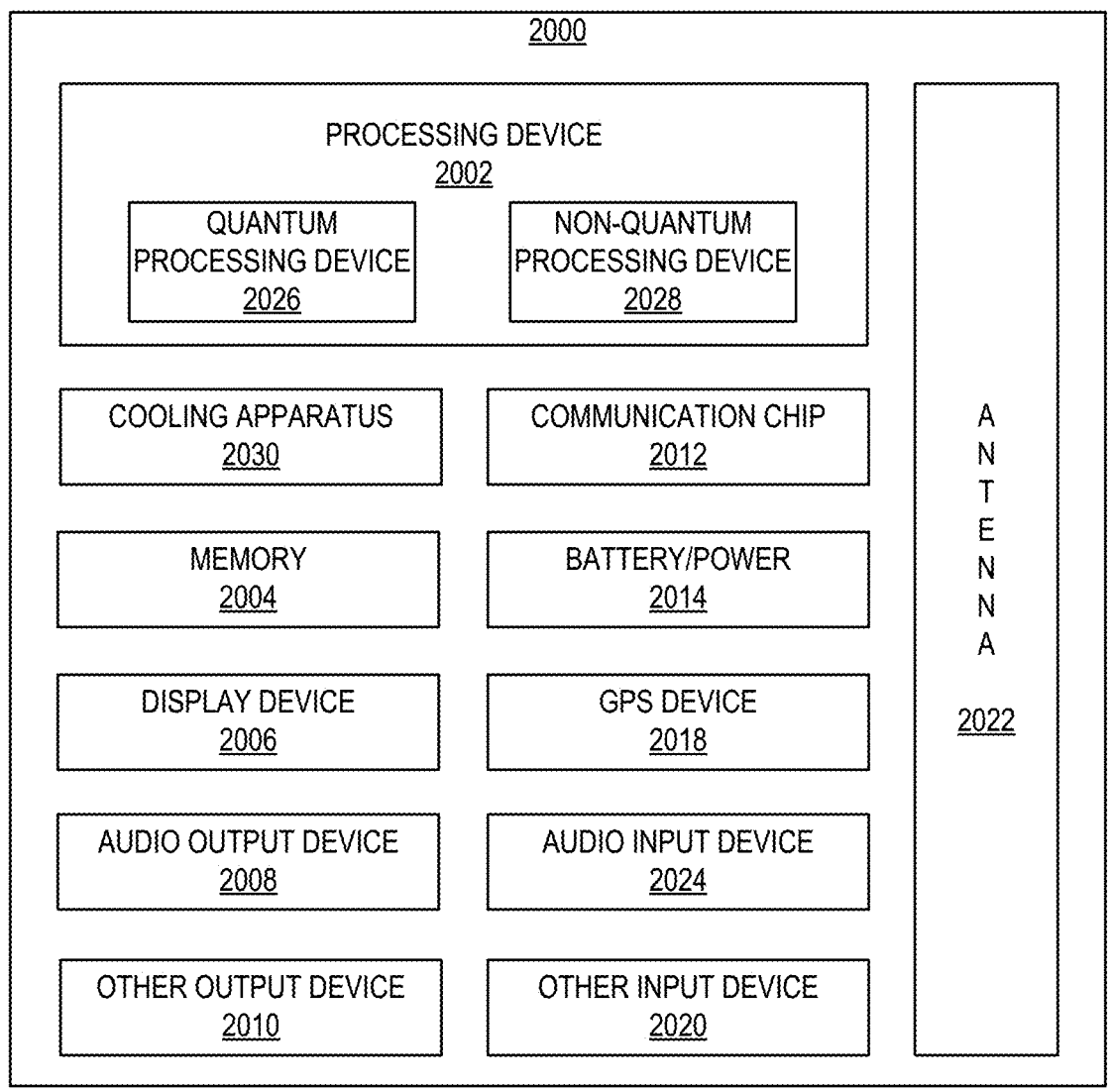
FIG. 51 is a block diagram of an example quantum computing device that may include any of the quantum dot devices disclosed herein, in accordance with various embodiments.

FIG. 51 is a block diagram of an example quantum computing device 2000 that may include any of the quantum dot devices disclosed herein. A number of components are illustrated in FIG. 51 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die.

Additionally, in various embodiments, the quantum computing device 2000 may not include one or more of the components illustrated in FIG. 51, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide examples of various ones of the embodiments disclosed herein.

Example 1 is a quantum dot device, including: a substrate; and a quantum well stack disposed on the substrate, wherein the quantum well stack includes a quantum well layer and a back gate, and the back gate is disposed between the quantum well layer and the substrate.

Example 2 may include the subject matter of Example 1, and may further specify that the back gate is spaced away from the quantum well layer by a barrier material.

Example 3 may include the subject matter of Example 2, and may further specify that the quantum well layer includes silicon, and the barrier material includes silicon germanium.

Example 4 may include the subject matter of Example 3, and may further specify that the barrier material includes a first layer of silicon germanium with a first germanium content and a second layer of silicon germanium with a second germanium content, the second germanium content is greater than the first germanium content, and the first layer of silicon germanium is disposed between the second layer of silicon germanium and the quantum well layer.

Example 5 may include the subject matter of any of Examples 3-4, and may further specify that the back gate is formed of doped silicon germanium.

Example 6 may include the subject matter of any of Examples 1-5, and may further specify that the back gate and the quantum well layer are spaced apart by a distance between 500 and 1500 angstroms.

Example 7 may include the subject matter of any of Examples 1-6, and may further specify that the back gate is formed of a doped semiconductor.

Example 8 may include the subject matter of Example 7, and may further specify that the back gate is doped with an n-type material.

Example 9 may include the subject matter of any of Examples 1-8, and may further include a plurality of gates disposed on the quantum well stack such that the quantum well stack is disposed between the plurality of gates and the back gate.

Example 10 may include the subject matter of any of Examples 1-9, and may further include a conductive contact extending adjacent to the quantum well stack to contact the back gate.

Example 11 may include the subject matter of Example 10, and may further specify that the conductive contact extends through an insulating material adjacent to the quantum well stack.

Example 12 may include the subject matter of any of Examples 1-9, and may further specify that the back gate is at least partially included in a fin extending away from a base, and the substrate is at least partially included in the base.

Example 13 may include the subject matter of Example 12, and may further specify that an insulating material is disposed on opposing faces of the fin.

Example 14 may include the subject matter of any of Examples 12-13, and may further specify that the quantum well stack is a first quantum well stack, the quantum well layer is a first quantum well layer, the fin is a first fin, the back gate is a first back gate, and the quantum dot device further includes: a second quantum well stack disposed on the substrate, wherein the second quantum well stack includes a second quantum well layer; and a second back gate disposed between the second quantum well layer and the substrate; wherein the second back gate is at least partially included in a second fin, different from the first fin, extending away from the base.

Example 15 may include the subject matter of any of Examples 12-14, and may further specify that the fin has a width between 10 and 30 nanometers.

Example 16 may include the subject matter of any of Examples 12-15, and may further specify that the fin has a tapered shape that is widest proximate to the base.

Example 17 is a method of operating a quantum dot device, including: applying one or more voltages to one or more gates on a first quantum well stack region to cause a first quantum dot to form in the first quantum well stack region, wherein a back gate is spaced apart from a quantum well layer in the first quantum well stack region such that the quantum well layer is disposed between the back gate and the one or more gates on the first quantum well stack region; applying one or more voltages to one or more gates on a second quantum well stack region to cause a second quantum dot to form in the second quantum well stack region; and sensing a quantum state of the first quantum dot with the second quantum dot.

Example 18 may include the subject matter of Example 17, and may further include applying a voltage to the back gate to control carrier flow between the back gate and the quantum well layer.

Example 19 may include the subject matter of Example 18, and may further specify that a barrier material is disposed between the back gate and the quantum well layer, and applying the voltage to the back gate includes adjusting the voltage on the back gate to cause a potential energy of the back gate to exceed a potential barrier caused by the barrier material.

Example 20 may include the subject matter of any of Examples 17-19, and may further specify that applying the one or more voltages to the one or more gates on the first quantum well stack region comprises applying a voltage to a first gate of the one or more gates to cause the first quantum dot to form in the first quantum well stack region under the first gate.

Example 21 may include the subject matter of any of Examples 17-20, and may further specify that sensing the quantum state of the first quantum dot with the second quantum dot comprises sensing a spin state of the first quantum dot with the second quantum dot.

Example 22 may include the subject matter of any of Examples 17-21, and may further include: applying the one or more voltages to the one or more gates on the first quantum well stack region to cause a third quantum dot to form in the first quantum well stack region; and prior to sensing the quantum state of the first quantum dot with the second quantum dot, allowing the first and third quantum dots to interact.

Example 23 may include the subject matter of Example 22, and may further specify that allowing the first and third quantum dots to interact comprises applying the one or more voltages to the one or more gates on the first quantum well stack region to control interaction between the first and third quantum dots.

Example 24 is a method of manufacturing a quantum dot device, including: providing a substrate; forming a quantum well stack on the substrate, wherein the quantum well stack includes a quantum well layer and a back gate; and forming a gate on the quantum well stack, wherein the quantum well stack is disposed between the gate and the back gate.

Example 25 may include the subject matter of Example 24, and may further specify that forming the quantum well stack on the substrate includes: providing a buffer material; and growing the back gate on the buffer material.

Example 26 may include the subject matter of Example 25, and may further specify that the buffer material and the back gate have a same lattice spacing.

Example 27 may include the subject matter of Example 26, and may further specify that the buffer material and the back gate are each formed of silicon germanium with a same germanium content.

Example 28 may include the subject matter of any of Examples 25-27, and may further specify that the back gate is a doped material.

Example 29 may include the subject matter of any of Examples 25-28, and may further specify that forming the quantum well stack on the substrate further includes: providing a barrier material on the back gate; and providing the quantum well layer on the barrier material.

Example 30 may include the subject matter of any of Examples 24-29, and may further specify that the substrate is silicon, and wherein forming the quantum well stack includes forming the back gate and the quantum well layer by epitaxy.

Example 31 may include the subject matter of any of Examples 24-30, and may further include, after forming the quantum well stack, removing at least some of the quantum well stack to form fins, wherein the fins include the quantum well layer.

Example 32 may include the subject matter of Example 31, and may further specify that the fins further include the back gate.

Example 33 may include the subject matter of any of Examples 24-32, and may further include: removing at least some of the quantum well stack to expose a portion of the back gate; and providing a conductive contact to the exposed portion of the back gate.

Example 34 is a quantum computing device, including: a quantum processing device, wherein the quantum processing device includes a first quantum well stack region and a second quantum well stack region, an active quantum well layer in the first quantum well stack region, a read quantum well layer in the second quantum well stack region, and back gates disposed in the first and second quantum well stack regions; a non-quantum processing device, coupled to the quantum processing device, to control voltages applied to gates on the first and second fin; and a memory device to store data generated by the read quantum well layer during operation of the quantum processing device.

Example 35 may include the subject matter of Example 34, and may further include a cooling apparatus to maintain a temperature of the quantum processing device below 5 degrees Kelvin.

Example 36 may include the subject matter of Example 35, and may further specify that the cooling apparatus includes a dilution refrigerator.

Example 37 may include the subject matter of Example 35, and may further specify that the cooling apparatus includes a liquid helium refrigerator.

Example 38 may include the subject matter of any of Examples 34-37, and may further specify that the memory device is to store instructions for a quantum computing algorithm to be executed by the quantum processing device.

Example 39 may include the subject matter of any of Examples 34-37, and may further specify that the back gates are formed of a doped semiconductor.

The invention claimed is:

1. A quantum dot device, comprising:
   a quantum processing device; and
   a non-quantum processing device,
   wherein the quantum processing device includes:
      a base,
      a fin extending away from the base and including a quantum well layer,
      a plurality of gates over the fin, wherein the plurality of gates extends away from the fin in a direction perpendicular to a longitudinal axis of the fin, and
      a gate dielectric between a first gate of the plurality of gates and the fin, wherein the gate dielectric does not contact any sidewalls of the fin, and
   wherein the non-quantum processing device is coupled to the quantum processing device and the non-quantum processing device is to control voltages applied to one or more of the plurality of gates during operation of the quantum processing device.

2. The quantum dot device of claim 1, further comprising a further gate, wherein:
   the further gate is at least partially included in the fin, and
   the further gate is closer to the base than the quantum well layer.

3. The quantum dot device of claim 2, wherein the further gate is spaced apart from the quantum well layer.

4. The quantum dot device of claim 3, further comprising a further material between the quantum well layer and the further gate, wherein the quantum well layer includes silicon, and the further material includes silicon and germanium.

5. The quantum dot device of claim 1, further comprising:
   a memory device to store data generated during operation of the quantum processing device.

6. The quantum dot device of claim 1, further comprising:
   a cooling apparatus to maintain a temperature of the quantum processing device below 5 degrees Kelvin.

7. The quantum dot device of claim 1, further comprising:
   an insulator material in contact with a sidewall of the fin, wherein a dimension of the insulator material in a direction perpendicular to the sidewall of the fin is at least 100 microns, wherein the sidewall is one of the sidewalls of the fin.

8. The quantum dot device of claim 7, wherein:
   the gate dielectric includes a first portion and a second portion,
   the first portion is between the first gate and the fin,
   the second portion is between the first gate and the insulator material, and the second portion is materially continuous with the first portion.

9. The quantum dot device of claim 7, wherein a material composition of the gate dielectric is different from a material composition of the insulator material.

10. A quantum dot device, comprising:
a base;
a fin extending away from the base and including a quantum well layer and a first gate;
a second gate over the fin, wherein the second gate extends away from the fin in a direction perpendicular to a longitudinal axis of the fin, and wherein the quantum well layer is between the first gate and the second gate;
an insulator material in contact with a sidewall of the fin, wherein the sidewall is parallel to a longitudinal axis of the fin; and
a gate dielectric comprising a first portion and a second portion, wherein the first portion is between the second gate and the fin, the second portion is between the second gate and the insulator material, and the second portion is materially continuous with the first portion.

11. The quantum dot device of claim 10, wherein the second portion of the gate dielectric is parallel to the quantum well layer.

12. The quantum dot device of claim 10, wherein the gate dielectric does not contact any sidewalls of the fin, and wherein the sidewall is one of the sidewalls of the fin.

13. The quantum dot device of claim 10, wherein a material composition of the gate dielectric is different from a material composition of the insulator material.

14. The quantum dot device of claim 10, wherein the first gate is a back gate, and the second gate is a top gate.

15. A quantum dot device, comprising:
a base;
a fin extending away from the base and including a quantum well layer;
a plurality of gates over the fin, wherein the plurality of gates extends away from the fin in a direction perpendicular to a longitudinal axis of the fin; and
a further gate, wherein the further gate is at least partially included in the fin, and wherein the further gate is closer to the base than the quantum well layer.

16. The quantum dot device of claim 15, further comprising an insulator material in contact with a sidewall of the fin, wherein the sidewall is one of the sidewalls of the fin.

17. The quantum dot device of claim 16, wherein a dimension of the insulator material in a direction perpendicular to the sidewall of the fin is at least 100 microns.

18. The quantum dot device of claim 16, further comprising a gate dielectric between a first gate of the plurality of gates and the fin, wherein the gate dielectric does not contact any sidewalls of the fin.

19. The quantum dot device of claim 15, wherein:
the quantum dot device is a quantum computing device,
the quantum computing device includes a quantum processing device, a non-quantum processing device, and a memory device,
the quantum processing device includes the base, the fin, the plurality of gates, and the further gate,
the non-quantum processing device is coupled to the quantum processing device and is to control voltages applied to one or more of the plurality of gates during operation of the quantum processing device, and
the memory device is to store data generated during operation of the quantum processing device.

20. A quantum computing device, comprising:
a quantum processing device, wherein the quantum processing device includes a quantum dot device comprising:
a base,
a fin extending away from the base and including a quantum well layer,
a plurality of gates over the fin, wherein the plurality of gates extends away from the fin in a direction perpendicular to a longitudinal axis of the fin, and
an insulator material in contact with a sidewall of the fin, wherein a dimension of the insulator material in a direction perpendicular to the sidewall of the fin is at least 100 microns; and
a non-quantum processing device, wherein the non-quantum processing device is coupled to the quantum processing device and the non-quantum processing device is to control voltages applied to one or more of the plurality of gates during operation of the quantum processing device.

21. The quantum computing device of claim 20, further comprising:
a cooling apparatus to maintain a temperature of the quantum processing device below 5 degrees Kelvin.

22. The quantum computing device of claim 20, further comprising:
a memory device to store data generated during operation of the quantum processing device.

* * * * *